(12) United States Patent
Roy et al.

(10) Patent No.: US 6,937,055 B2
(45) Date of Patent: Aug. 30, 2005

(54) PROGRAMMABLE I/O BUFFER

(75) Inventors: Richard Stephen Roy, Danville, CA (US); Ali Massoumi, Morgan Hill, CA (US); Chao-Wu Chen, San Jose, CA (US)

(73) Assignee: Mosaic Systems, Inc., Sunnyvale, CA (US)

( * ) Notice: Subject to any disclaimer, the term of this patent is extended or adjusted under 35 U.S.C. 154(b) by 54 days.

(21) Appl. No.: 10/328,907

(22) Filed: Dec. 23, 2002

(65) Prior Publication Data

US 2004/0119497 A1 Jun. 24, 2004

(51) Int. Cl.$^7$ .......................................... H03K 19/003
(52) U.S. Cl. ............................................. 326/30; 326/27
(58) Field of Search ............................. 326/30, 26–27, 326/22–25, 83, 86

(56) References Cited

U.S. PATENT DOCUMENTS

| | | | |
|---|---|---|---|
| 4,719,369 A | * | 1/1988 | Asano et al. ................. 326/30 |
| 5,602,494 A | * | 2/1997 | Sundstrom ................... 326/39 |
| 6,366,129 B1 | * | 4/2002 | Douglas et al. ............... 326/86 |
| 6,642,740 B2 | * | 11/2003 | Kim et al. ..................... 326/30 |

FOREIGN PATENT DOCUMENTS

JP           06163630 A  *  6/1994   ........... H01L/21/60

* cited by examiner

*Primary Examiner*—James H. Cho
(74) *Attorney, Agent, or Firm*—Alan H. MacPherson; MacPherson Kwok Chen & Heid LLP

(57) ABSTRACT

A programmable input/output buffer has a first plurality of pull-down transistors connected between a supply voltage and an electrical system conductor on the integrated circuit and a second plurality of pull-down transistors connected between the electrical conductor and the system reference voltage. Reference circuits generate signals to turn on a first number of said first plurality of pull-up transistors and/or a second number of said second plurality of pull-down transistors to provide an input/output buffer impedance matching the impedance of the external transmission line either sending a signal to the programmable input/output buffer or receiving a signal from the programmable input/output buffer.

31 Claims, 18 Drawing Sheets

*Input/Output Buffer Drive Structure of Current Invention*

Note: L=0.35um for all devices in this structure. These are typically thicker oxide and deeper junction devices than normal internal logic devices, which have minimum L=0.13um for this process.

*Ideal Output Buffer Drive Structure*

*Ideal Input Receiver Structure with Parallel Termination*

Pre-Driver Stages for bit n (n=0-17) of Pullup of Current Invention

Pre-Driver Stages for bit n (n=0-15) of Pulldown of Current Invention

FIG. 10a-1

| X<br>0 1 2 3 4 5<br>Output N Device Sizes | RN0<br>WN0<br>L6=20 | 7<br>WN7<br>L7=22 | 8<br>WN8<br>L8=25 | 9<br>WN9<br>L9=28 | 10<br>WN10<br>L10=31 | 11<br>WN11<br>L11=34 | 12<br>WN12<br>L12=37 | RN1<br>WN1<br>L5=20 |
|---|---|---|---|---|---|---|---|---|
| 0 | 1 | | | | | | | |
| 1 | | 1 | | | | | | |
| 2 | | | 1 | | | | | |
| 3 | | | | 1 | | | | |
| 4 | | | | | 1 | | | |
| 5 | | | | | | 1 | | |
| 6 | | | | | | | 1 | |
| 7 | 1 | | | | | | | |
| 8 | | 1 | | | | | | |
| 9 | | | 1 | | | | | |
| 10 | | | | 1 | | | | |
| 11 | | | | | 1 | | | |
| 12 | | | | | | 1 | | |
| 13 | | | | | | | 1 | |
| 14 | 1 | | | | | | | |
| 15 | | 1 | | | | | | |
| 16 | | | 1 | | | | | |
| 17 | | | | 1 | | | | |
| 18 | | | | | 1 | | | |
| 19 | | | | | | 1 | | |
| 20 | | | | | | | 1 | |
| 21 | 1 | | | | | | | |
| 22 | | 1 | | | | | | |
| 23 | | | 1 | | | | | |
| 24 | | | | 1 | | | | |
| 25 | | | | | 1 | | | |
| 26 | | | | | | 1 | | |
| 27 | | | | | | | 1 | |

FIG. 10a-2

| 2<br>WN2<br>L4=20 | 3<br>WN3<br>L3=20 | 4<br>WN4<br>L2=20 | 5<br>WN5<br>L1=20 | 6<br>WN6<br>L0=20 | Total | | | | | |
|---|---|---|---|---|---|---|---|---|---|---|
| | | | | | 20 | | | | | |
| | | | | | 22 | | | | | |
| | | | | | 25 | | | | | |
| | | | | | 28 | | | | | |
| | | | | | 31 | | | | | |
| | | | | | 34 | | | | | |
| | | | | | 37 | | | | | |
| | | | | 1 | 40 | | | | | |
| | | | | 1 | 42 | | | | | |
| | | | | 1 | 45 | | | | | |
| | | | | 1 | 48 | | | | | |
| | | | | 1 | 51 | | | | | |
| | | | | 1 | 54 | | | | | |
| | | | | 1 | 57 | | | | | |
| | | | 1 | 1 | 60 | | | | | |
| | | | 1 | 1 | 62 | | | | | |
| | | | 1 | 1 | 65 | | | | | |
| | | | 1 | 1 | 68 | | | | | |
| | | | 1 | 1 | 71 | | | | | |
| | | | 1 | 1 | 74 | | | | | |
| | | | 1 | 1 | 77 | | | | | |
| | | 1 | 1 | 1 | 80 | | | | | |
| | | 1 | 1 | 1 | 82 | | | | | |
| | | 1 | 1 | 1 | 85 | | | | | |
| | | 1 | 1 | 1 | 88 | | | | | |
| | | 1 | 1 | 1 | 91 | | | | | |
| | | 1 | 1 | 1 | 94 | | | | | |
| | | 1 | 1 | 1 | 97 | | | | | |

| Row | 1 | 2 | 3 | 4 | 5 | 6 | 7 | 8 |
|---|---|---|---|---|---|---|---|---|
| 28 | 1 | | | | | | | |
| 29 | | 1 | | | | | | |
| 30 | | | 1 | | | | | |
| 31 | | | | 1 | | | | |
| 32 | | | | | 1 | | | |
| 33 | | | | | | 1 | | |
| 34 | | | | | | | 1 | |
| 35 | 1 | | | | | | | |
| 36 | | 1 | | | | | | |
| 37 | | | 1 | | | | | |
| 38 | | | | 1 | | | | |
| 39 | | | | | 1 | | | |
| 40 | | | | | | 1 | | |
| 41 | | | | | | | 1 | |
| 42 | 1 | | | | | | | 1 |
| 43 | | 1 | | | | | | 1 |
| 44 | | | 1 | | | | | 1 |
| 45 | | | | 1 | | | | 1 |
| 46 | | | | | 1 | | | 1 |
| 47 | | | | | | 1 | | 1 |
| 48 | | | | | | | 1 | 1 |

FIG. 10a-3

| | 1 | 1 | 1 | 1 | 100 | | | | | |
|---|---|---|---|---|---|---|---|---|---|---|
| | 1 | 1 | 1 | 1 | 102 | | | | | |
| | 1 | 1 | 1 | 1 | 105 | | | | | |
| | 1 | 1 | 1 | 1 | 108 | | | | | |
| | 1 | 1 | 1 | 1 | 111 | | | | | |
| | 1 | 1 | 1 | 1 | 114 | | | | | |
| | 1 | 1 | 1 | 1 | 117 | | | | | |
| 1 | 1 | 1 | 1 | 1 | 120 | | | | | |
| 1 | 1 | 1 | 1 | 1 | 122 | | | | | |
| 1 | 1 | 1 | 1 | 1 | 125 | | | | | |
| 1 | 1 | 1 | 1 | 1 | 128 | | | | | |
| 1 | 1 | 1 | 1 | 1 | 131 | | | | | |
| 1 | 1 | 1 | 1 | 1 | 134 | | | | | |
| 1 | 1 | 1 | 1 | 1 | 137 | | | | | |
| 1 | 1 | 1 | 1 | 1 | 140 | | | | | |
| 1 | 1 | 1 | 1 | 1 | 142 | | | | | |
| 1 | 1 | 1 | 1 | 1 | 145 | | | | | |
| 1 | 1 | 1 | 1 | 1 | 148 | | | | | |
| 1 | 1 | 1 | 1 | 1 | 151 | | | | | |
| 1 | 1 | 1 | 1 | 1 | 154 | | | | | |
| 1 | 1 | 1 | 1 | 1 | 157 | | | | | |
| | | | | | | | | | | |

*FIG. 10a-4*

| Fig. 10a-1 | Fig. 10a-2 |
|---|---|
| Fig. 10a-3 | Fig. 10a-4 |

Key To
*FIG. 10a*

*FIG. 10b-1*

| Output N Device Sizes | RP 0 WP 0 L12=20 | 13 WP 13 L13=24 | 14 WP 14 L14=28 | 15 WP 15 L15=32 | 16 WP 16 L16=36 | 1 WP 1 L11=20 | 2 WP 2 L10=20 | 3 WP 3 L9=20 |
|---|---|---|---|---|---|---|---|---|
| 0 | 1 | | | | | | | |
| 1 | | 1 | | | | | | |
| 2 | | | 1 | | | | | |
| 3 | | | | 1 | | | | |
| 4 | | | | | 1 | | | |
| 5 | 1 | | | | | | | |
| 6 | | 1 | | | | | | |
| 7 | | | 1 | | | | | |
| 8 | | | | 1 | | | | |
| 9 | | | | | 1 | | | |
| 10 | 1 | | | | | | | |
| 11 | | 1 | | | | | | |
| 12 | | | 1 | | | | | |
| 13 | | | | 1 | | | | |
| 14 | | | | | 1 | | | |
| 15 | 1 | | | | | | | |
| 16 | | 1 | | | | | | |
| 17 | | | 1 | | | | | |
| 18 | | | | 1 | | | | |
| 19 | | | | | 1 | | | |
| 20 | 1 | | | | | | | |
| 21 | | 1 | | | | | | |
| 22 | | | 1 | | | | | |
| 23 | | | | 1 | | | | |
| 24 | | | | | 1 | | | |
| 25 | 1 | | | | | | | |
| 26 | | 1 | | | | | | |

FIG. 10b-2

| | 4 WP 4 | 5 WP 5 | 6 WP 6 | 7 WP 7 | 8 WP 8 | 9 WP 9 | 10 WP 10 | 11 WP 11 | 12 WP 12 | 17 WP 17 | |
|---|---|---|---|---|---|---|---|---|---|---|---|
| L6=20 | L7=20 | L8=20 | L5=20 | L4=20 | L3=20 | L2=20 | L1=20 | L0=20 | LVDD=20 | Total |
| | | | | | | | | | 1 | 40 |
| | | | | | | | | | 1 | 44 |
| | | | | | | | | | 1 | 48 |
| | | | | | | | | | 1 | 52 |
| | | | | | | | | | 1 | 56 |
| | | | | | | | | 1 | 1 | 60 |
| | | | | | | | | 1 | 1 | 64 |
| | | | | | | | | 1 | 1 | 68 |
| | | | | | | | | 1 | 1 | 72 |
| | | | | | | | | 1 | 1 | 76 |
| | | | | | | | 1 | 1 | 1 | 80 |
| | | | | | | | 1 | 1 | 1 | 84 |
| | | | | | | | 1 | 1 | 1 | 88 |
| | | | | | | | 1 | 1 | 1 | 92 |
| | | | | | | | 1 | 1 | 1 | 96 |
| | | | | | | 1 | 1 | 1 | 1 | 100 |
| | | | | | | 1 | 1 | 1 | 1 | 104 |
| | | | | | | 1 | 1 | 1 | 1 | 108 |
| | | | | | | 1 | 1 | 1 | 1 | 112 |
| | | | | | | 1 | 1 | 1 | 1 | 116 |
| | | | | | 1 | 1 | 1 | 1 | 1 | 120 |
| | | | | | 1 | 1 | 1 | 1 | 1 | 124 |
| | | | | | 1 | 1 | 1 | 1 | 1 | 128 |
| | | | | | 1 | 1 | 1 | 1 | 1 | 132 |
| | | | | | 1 | 1 | 1 | 1 | 1 | 136 |
| | | | | 1 | 1 | 1 | 1 | 1 | 1 | 140 |
| | | | | 1 | 1 | 1 | 1 | 1 | 1 | 144 |

|   |   |   |   |   |   |   |   |   |
|---|---|---|---|---|---|---|---|---|
| 27 |   |   | 1 |   |   |   |   |   |
| 28 |   |   |   | 1 |   |   |   |   |
| 29 |   |   |   |   | 1 |   |   |   |
| 30 | 1 |   |   |   |   |   |   |   |
| 31 |   | 1 |   |   |   |   |   |   |
| 32 |   |   | 1 |   |   |   |   |   |
| 33 |   |   |   | 1 |   |   |   |   |
| 34 |   |   |   |   | 1 |   |   |   |
| 35 | 1 |   |   |   |   |   |   |   |
| 36 |   | 1 |   |   |   |   |   |   |
| 37 |   |   | 1 |   |   |   |   |   |
| 38 |   |   |   | 1 |   |   |   |   |
| 39 |   |   |   |   | 1 |   |   |   |
| 40 | 1 |   |   |   |   |   |   |   |
| 41 |   | 1 |   |   |   |   |   |   |
| 42 |   |   | 1 |   |   |   |   |   |
| 43 |   |   |   | 1 |   |   |   |   |
| 44 |   |   |   |   | 1 |   |   |   |
| 45 | 1 |   |   |   |   |   |   |   |
| 46 |   | 1 |   |   |   |   |   |   |
| 47 |   |   | 1 |   |   |   |   |   |
| 48 |   |   |   | 1 |   |   |   |   |
| 49 |   |   |   |   | 1 |   |   |   |
| 50 | 1 |   |   |   |   |   |   | 1 |
| 51 |   | 1 |   |   |   |   |   | 1 |
| 52 |   |   | 1 |   |   |   |   | 1 |
| 53 |   |   |   | 1 |   |   |   | 1 |
| 54 |   |   |   |   | 1 |   |   | 1 |
| 55 | 1 |   |   |   |   |   | 1 | 1 |
| 56 |   | 1 |   |   |   |   | 1 | 1 |
| 57 |   |   | 1 |   |   |   | 1 | 1 |
| 58 |   |   |   | 1 |   |   | 1 | 1 |
| 59 |   |   |   |   | 1 |   | 1 | 1 |

FIG. 10b-3

| | | | | | | | | | | |
|---|---|---|---|---|---|---|---|---|---|---|
| | | | | 1 | 1 | 1 | 1 | 1 | 1 | 148 |
| | | | | 1 | 1 | 1 | 1 | 1 | 1 | 152 |
| | | | | 1 | 1 | 1 | 1 | 1 | 1 | 156 |
| | | | 1 | 1 | 1 | 1 | 1 | 1 | 1 | 160 |
| | | | 1 | 1 | 1 | 1 | 1 | 1 | 1 | 164 |
| | | | 1 | 1 | 1 | 1 | 1 | 1 | 1 | 168 |
| | | | 1 | 1 | 1 | 1 | 1 | 1 | 1 | 172 |
| | | | 1 | 1 | 1 | 1 | 1 | 1 | 1 | 176 |
| | | 1 | 1 | 1 | 1 | 1 | 1 | 1 | 1 | 180 |
| | | 1 | 1 | 1 | 1 | 1 | 1 | 1 | 1 | 184 |
| | | 1 | 1 | 1 | 1 | 1 | 1 | 1 | 1 | 188 |
| | | 1 | 1 | 1 | 1 | 1 | 1 | 1 | 1 | 192 |
| | | 1 | 1 | 1 | 1 | 1 | 1 | 1 | 1 | 196 |
| | 1 | 1 | 1 | 1 | 1 | 1 | 1 | 1 | 1 | 200 |
| | 1 | 1 | 1 | 1 | 1 | 1 | 1 | 1 | 1 | 204 |
| | 1 | 1 | 1 | 1 | 1 | 1 | 1 | 1 | 1 | 208 |
| | 1 | 1 | 1 | 1 | 1 | 1 | 1 | 1 | 1 | 212 |
| | 1 | 1 | 1 | 1 | 1 | 1 | 1 | 1 | 1 | 216 |
| 1 | 1 | 1 | 1 | 1 | 1 | 1 | 1 | 1 | 1 | 220 |
| 1 | 1 | 1 | 1 | 1 | 1 | 1 | 1 | 1 | 1 | 224 |
| 1 | 1 | 1 | 1 | 1 | 1 | 1 | 1 | 1 | 1 | 228 |
| 1 | 1 | 1 | 1 | 1 | 1 | 1 | 1 | 1 | 1 | 232 |
| 1 | 1 | 1 | 1 | 1 | 1 | 1 | 1 | 1 | 1 | 236 |
| 1 | 1 | 1 | 1 | 1 | 1 | 1 | 1 | 1 | 1 | 240 |
| 1 | 1 | 1 | 1 | 1 | 1 | 1 | 1 | 1 | 1 | 244 |
| 1 | 1 | 1 | 1 | 1 | 1 | 1 | 1 | 1 | 1 | 248 |
| 1 | 1 | 1 | 1 | 1 | 1 | 1 | 1 | 1 | 1 | 252 |
| 1 | 1 | 1 | 1 | 1 | 1 | 1 | 1 | 1 | 1 | 256 |
| 1 | 1 | 1 | 1 | 1 | 1 | 1 | 1 | 1 | 1 | 260 |
| 1 | 1 | 1 | 1 | 1 | 1 | 1 | 1 | 1 | 1 | 264 |
| 1 | 1 | 1 | 1 | 1 | 1 | 1 | 1 | 1 | 1 | 268 |
| 1 | 1 | 1 | 1 | 1 | 1 | 1 | 1 | 1 | 1 | 272 |
| 1 | 1 | 1 | 1 | 1 | 1 | 1 | 1 | 1 | 1 | 276 |

*FIG. 10b-4*

| | | | | | | | | |
|---|---|---|---|---|---|---|---|---|
| 60 | 1 |   |   |   |   | 1 | 1 | 1 |
| 61 |   | 1 |   |   |   | 1 | 1 | 1 |
| 62 |   |   | 1 |   |   | 1 | 1 | 1 |
| 63 |   |   |   | 1 |   | 1 | 1 | 1 |
| 64 |   |   |   |   | 1 | 1 | 1 | 1 |
| 65 |   |   | 1 | 1 |   |   | 1 | 1 |
| 66 | 1 | 1 |   |   |   | 1 | 1 | 1 |
| 67 | 1 |   | 1 |   |   | 1 | 1 | 1 |
| 68 | 1 |   |   | 1 |   | 1 | 1 | 1 |
| 69 | 1 |   |   |   | 1 | 1 | 1 | 1 |
| 70 |   |   | 1 | 1 |   | 1 | 1 | 1 |
| 71 |   | 1 | 1 | 1 |   |   | 1 | 1 |
| 72 |   | 1 | 1 |   | 1 |   | 1 | 1 |
| 73 |   | 1 |   | 1 | 1 |   | 1 | 1 |
| 74 |   |   | 1 | 1 | 1 |   | 1 | 1 |
| 75 | 1 |   | 1 | 1 |   | 1 | 1 | 1 |
| 76 |   | 1 | 1 | 1 |   | 1 | 1 | 1 |
| 77 |   | 1 | 1 |   | 1 | 1 | 1 | 1 |
| 78 |   | 1 |   | 1 | 1 | 1 | 1 | 1 |
| 79 |   |   | 1 | 1 | 1 | 1 | 1 | 1 |
| 80 |   | 1 | 1 | 1 | 1 |   | 1 | 1 |

*FIG. 10b-5*

| 1 | 1 | 1 | 1 | 1 | 1 | 1 | 1 | 1 | 1 | 280 |
|---|---|---|---|---|---|---|---|---|---|-----|
| 1 | 1 | 1 | 1 | 1 | 1 | 1 | 1 | 1 | 1 | 284 |
| 1 | 1 | 1 | 1 | 1 | 1 | 1 | 1 | 1 | 1 | 288 |
| 1 | 1 | 1 | 1 | 1 | 1 | 1 | 1 | 1 | 1 | 292 |
| 1 | 1 | 1 | 1 | 1 | 1 | 1 | 1 | 1 | 1 | 296 |
| 1 | 1 | 1 | 1 | 1 | 1 | 1 | 1 | 1 | 1 | 300 |
| 1 | 1 | 1 | 1 | 1 | 1 | 1 | 1 | 1 | 1 | 304 |
| 1 | 1 | 1 | 1 | 1 | 1 | 1 | 1 | 1 | 1 | 308 |
| 1 | 1 | 1 | 1 | 1 | 1 | 1 | 1 | 1 | 1 | 312 |
| 1 | 1 | 1 | 1 | 1 | 1 | 1 | 1 | 1 | 1 | 316 |
| 1 | 1 | 1 | 1 | 1 | 1 | 1 | 1 | 1 | 1 | 320 |
| 1 | 1 | 1 | 1 | 1 | 1 | 1 | 1 | 1 | 1 | 324 |
| 1 | 1 | 1 | 1 | 1 | 1 | 1 | 1 | 1 | 1 | 328 |
| 1 | 1 | 1 | 1 | 1 | 1 | 1 | 1 | 1 | 1 | 332 |
| 1 | 1 | 1 | 1 | 1 | 1 | 1 | 1 | 1 | 1 | 336 |
| 1 | 1 | 1 | 1 | 1 | 1 | 1 | 1 | 1 | 1 | 340 |
| 1 | 1 | 1 | 1 | 1 | 1 | 1 | 1 | 1 | 1 | 344 |
| 1 | 1 | 1 | 1 | 1 | 1 | 1 | 1 | 1 | 1 | 348 |
| 1 | 1 | 1 | 1 | 1 | 1 | 1 | 1 | 1 | 1 | 352 |
| 1 | 1 | 1 | 1 | 1 | 1 | 1 | 1 | 1 | 1 | 356 |
| 1 | 1 | 1 | 1 | 1 | 1 | 1 | 1 | 1 | 1 | 360 |

*FIG. 10b-6*

| Fig. 10b-1 | Fig. 10b-2 |
|------------|------------|
| Fig. 10b-3 | Fig. 10b-4 |
| Fig. 10b-5 | Fig. 10b-6 |

Key To
*FIG. 10b*

US 6,937,055 B2

PROGRAMMABLE I/O BUFFER

FIELD OF THE INVENTION

This invention relates to I/O buffers for integrated circuits and, in particular, to an I/O buffer which is programmable to match the impedance of an off-chip transmission line connected to the I/O buffer.

BACKGROUND OF THE INVENTION

An integrated circuit chip is driven by off-chip signals transmitted to the chip on a transmission line from other components in the system or from outside the system. Alternatively, the integrated circuit chip sends signals to other components in the system or outside the system via the transmission line. Typically the transmission line is on a printed circuit board or equivalent. An input/output (I/O) buffer on the chip provides an interface between the circuitry on the chip and the transmission line. The impedance of the I/O buffer ideally matches the impedance of the transmission line. FIG. 1 shows an ideal output buffer drive structure wherein a signal from an output buffer 101 on a semiconductor integrated circuit chip is transmitted to transmission line 102 off-chip. If the signal is a high level signal, then ideal switch S1 is closed and the output signal approaches VDDQ through pull-up resistor R1 of 50 ohms. The 50 ohms pull-up resistor matches the impedance of the transmission line 102, which is also 50 ohms. If the signal is a low level signal, then ideal switch S1 is open and ideal switch S2 is closed, thereby allowing 50 ohm pull-down resistor R2 to pull the output signal down to Vss, the system ground. Again, the impedance of resistor R2 matches the 50 ohm impedance of the transmission line 102.

Often, the output buffer drive structure is part of a programmable input/output structure capable of being configured to either receive or send signals. While the ideal structure in FIG. 1 sends signals from on chip to off-chip through transmission line 102, the structure in FIG. 2 represents an ideal input receiver with parallel termination. When a signal is being received from transmission line 102 by input receiver 201, the impedance of the input receiver ideally matches the impedance of the transmission line. As shown in FIG. 2, the transmission line 102 has a 50 ohm impedance. The input receiver will match that impedance when ideal switches S3 and S4 are simultaneously closed, placing resistors R3 and R4, each of 100 ohms, essentially in parallel for an AC signal. The parallel arrangement of resistors R3 and R4 results in an equivalent 50 ohm impedance associated with the ideal input receiver structure of FIG. 2. The signal received by the input receiver is then passed through input amplifier A1, which receives on one input lead a reference signal equal to one half of the input voltage Vddi (i.e., Vddi/2) and on the other input lead, the signal from the 50 ohm transmission line 102. The input amplifier A1 then amplifies the signal in preparation for the amplified signal to be sent to other circuitry on the integrated circuit chip. The main advantage of perfect matching between the input termination impedance and the transmission line is to minimize or eliminate reflection back along transmission line 102. Any reflection of this type will cause inter-symbol interference (ISI) with the subsequently transferred signal into receiver 201 reducing the worst case signal amplitude, and ultimately the maximum reliable frequency of operation.

Unfortunately, the structures shown in FIGS. 1 and 2 are ideal. In the real world, the impedance of the output buffer drive structure or the input receiver structure never exactly matches the impedance of the transmission line 102. Accordingly, it is desired to have a structure which can be programmably adjusted to match the impedance associated with the transmission line providing a signal to or receiving a signal from the programmable I/O buffer.

Moreover, the design of the I/O buffers on an integrated circuit chip is becoming more crucial as operating frequencies of the systems are increased. Typically, a chip-to-chip connection across a printed circuit board is, at most, a few inches and, for maximum system operating frequency, reflections must be avoided. The design of the I/O buffer must balance a number of conflicting constraints. Among these constraints are the fact that the design must be resistant to electrostatic discharge (typically, the smaller the channel width on the transistor, the more susceptible the transistor is to being destroyed by an electrostatic discharge), while at the same time, the total width must be kept as small as possible to keep down the drain diode capacitance associated with the device. Furthermore, an output device generally has a larger capacitance than an input device because an output device has to provide a stronger signal to the transmission line than the input device has to provide to the chip. Moreover, both the source/channel capacitance and the drain/channel capacitance are of concern in the design of the structure. Typically, to help avoid susceptibility to electrostatic discharge ("ESD"), a 20 micron minimum width is required for each MOS transistor (either a PMOS or an NMOS transistor). Wafer foundries often have minimum channel width requirements of 20 microns. This limits the impedance granularity (i.e., the variation in width of the input termination and output drive transistors), which can be obtained for a fixed length channel in the MOS transistor. Moreover, output devices tend to have thicker oxides and deeper implants than normal internal devices, again reflecting the fact that the output devices have to be more robust to handle extremely high ESD discharge voltages.

Thus, to provide a high speed I/O buffer for today's high speed systems, the buffer must have minimum capacitance, minimum reflections of incoming and outgoing signals, and maximum ESD protection. While the I/O buffer must be as finely granular as possible in the sense of allowing the input impedance and output impedance to be changed in as fine a degree as possible, the granularity is limited by the requirement that the minimum transistor channel width for a given-channel length cannot go below 20 microns.

The HSTL standard for programmable I/O buffers uses an externally applied resistor on a special ZT input pad for the input circuit, and an externally applied resistor on a special ZQ pad for the output circuit to match impedance with the transmission lines. Advantageously, using these external non-temperature sensitive resistors to set the impedance of the input termination and output drive strength avoids the significant variation of impedance with temperature exhibited by the input termination and output drive MOS devices.

SUMMARY OF THE INVENTION

In accordance with this invention, a structure is provided for a programmable input/output buffer drive or an integrated circuit chip which allows the impedance of the input/output buffer to be matched to the external transmission line to which a signal is either to be sent or from which a signal is to be received. In accordance with this invention, a plurality of transistors is provided on chip connected in parallel between a high voltage source such as VDDQ and an electrical conductor connected to the off-chip transmission line. A second plurality of transistors is provided on chip connected between the electrical conductor and the system ground. To drive a high level signal, selected ones of the transistors between the high voltage source and the electrical conductor connected to the off-chip transmission line will be turned on. To drive a low level signal, selected ones of the transistors between the electrical conductor and the system ground will be turned on. In both cases the particular transistors selected to be turned on will be those which will cause the impedance of the output buffer to most closely match the impedance of the transmission line. Likewise, when a signal is to be received from the transmission line, selected ones of the first plurality of transistors in conjunction with selected ones of the second plurality of transistors will be turned on to provide two parallel impedances to the AC signal from the transmission line to most closely match the impedance of the transmission line, thereby to reduce the reflections associated with receipt of a signal from the transmission line.

The first set of transistors on chip connected between the high voltage source and the electrically conductive lead on the chip and the second set of transistors on chip connected between the electrically conductive lead on the chip and the system ground are more rugged than the transistors on the chip used for internal logic operations. The devices associated with the programmable input/output buffer typically have thicker gate oxides and deeper junctions than the logic devices internal to the chip. Typically, the logic devices internal to the chip will have shorter channel lengths and thinner gate oxides, among other differences. The more robust nature of the transistors used in the input/output circuitry makes these transistors more resistant to electrostatic discharge.

The circuitry of this invention allows the programmable input/output buffer to be programmed to match the characteristics of the actual transmission line to which a signal will be sent or from which a signal will be received. This reduces the amplitude of any reflections at the interface between the input/output buffer and the transmission line and, thus, allows the integrated circuit containing the input/output buffer of this invention to operate at higher system frequencies than in the prior art.

The circuitry of this invention incorporates a number of novel features.

In accordance with this invention, the programmable input/output buffer serves three functions: it allows the input impedance of the integrated circuit to be controlled; it allows the output impedance of the I/O buffer, and thus of the integrated circuit, to be controlled; and it provides robust electrostatic discharge protection.

The pull-up and pull-down devices employed in the programmable input/output buffer have their device sizes carefully selected so as to minimize, if not avoid, electrostatic discharge problems. At the same time, the device sizes are selected to provide a range of possible impedances for the input/output buffer with fine granularity and yet maintain a total width for all devices within a narrow range so as to minimize capacitance.

A programmable logic array in combination with a comparator and a counter provides continuous output signals to continuously match the impedance of the programmable input/output buffer with the transmission line impedance.

The circuitry used to generate the signals to control the input impedance and the output impedance of the input/output buffer utilizes a true voltage divider to provide a more accurate match with the impedance of the external transmission line connected to the I/O port. The use of a true voltage divider ensures that the reference voltage to be used in providing the correct I/O buffer impedance is proper in view of the actual transmission line impedance.

Although the widths of the pull-down and pull-up transistors used in one embodiment of the programmable input/output buffer vary from 20 to 37 microns, the actual incremental changes in width of the composite structures capable of being implemented in accordance with this invention vary from about 15% down to a much lower percentage. In accordance with one embodiment of this invention, approximately two (2) or three (3) and four (4) micron increments are selected for the incremental changes in total widths of the turned-on transistors used in the programmable pull-down and pull-up structures, respectively. Other incremental changes in width could also be selected depending upon the number of transistors used in the pull-down and pull-up transistor structures. For example, to change the total widths of the turned-on transistors in the pull-down and pull-up structures in one micron increments in accordance with this invention, a larger number of transistors would have to be used in the pull-down and pull-up structures. This would increase the total width of the transistors required in the circuitry and this would add capacitance. Therefore, the incremental increase in the total widths of the turned-on transistors in the pull-down and pull-up transistor structures associated with this invention is selected to be 2 or 3 microns for the N-channel pull-down transistors and to be 4 microns for the P-channel pull-up transistors. Other incremental changes in the total widths of the turned-on transistors in the pull-down and pull-up transistor structures can also be selected in accordance with the principles of this invention.

This invention will be more fully understood in conjunction with the drawings and the following detailed description.

BRIEF DESCRIPTION OF THE DRAWINGS

FIGS. 10a and 10b are matrices showing along the horizontal axes the widths of the N-channel pull-down transistors and the P-channel pull-up transistors respectively, and showing along the right-most vertical axes the total effective widths of the turned-on pull-down transistors and turned-on pull-up transistors, respectively, when selected subsets of pull-down transistors and pull-up transistors are turned on by the code along the left side vertical axes.

DETAILED DESCRIPTION OF THE EMBODIMENT(S)

The following description is meant to be illustrative only and not limiting. Other embodiments of this invention will be obvious in view of this description.

Figure 1:
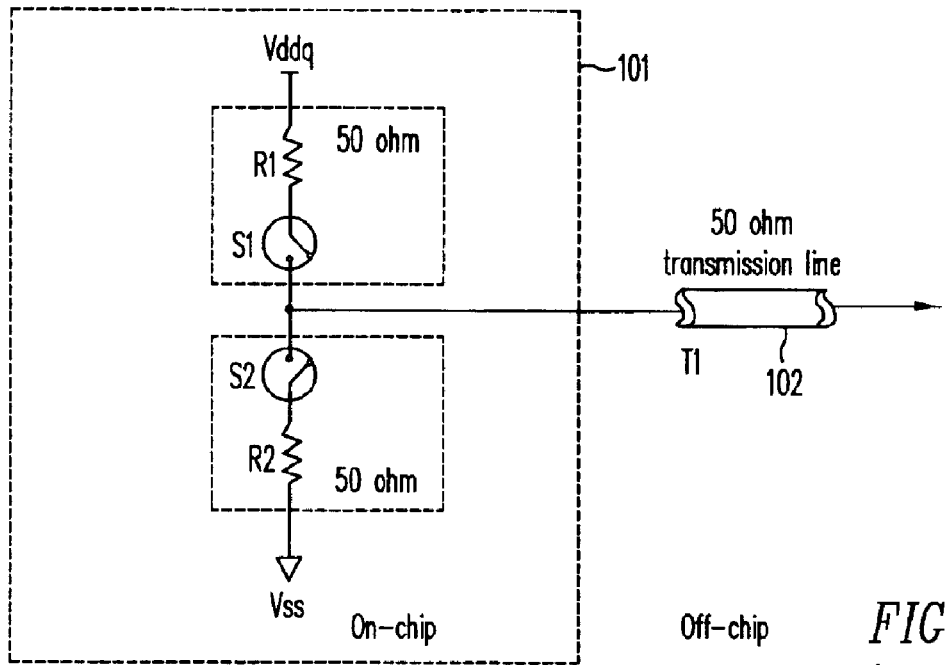
FIG. 1 shows an ideal output buffer drive structure.
Figure 2:
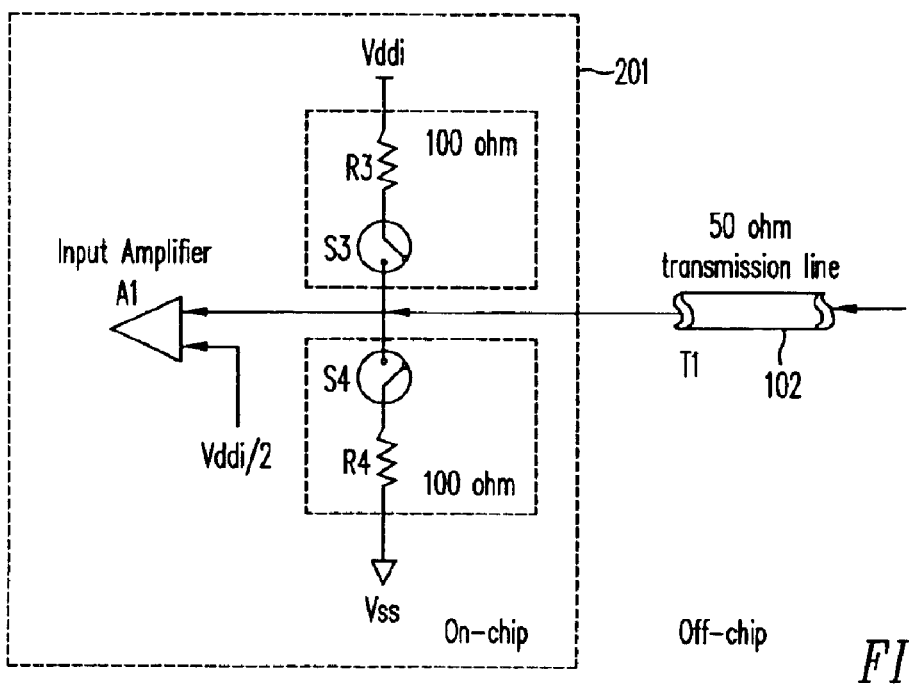
FIG. 2 shows an ideal input receiver structure with parallel termination.
Figure 3:
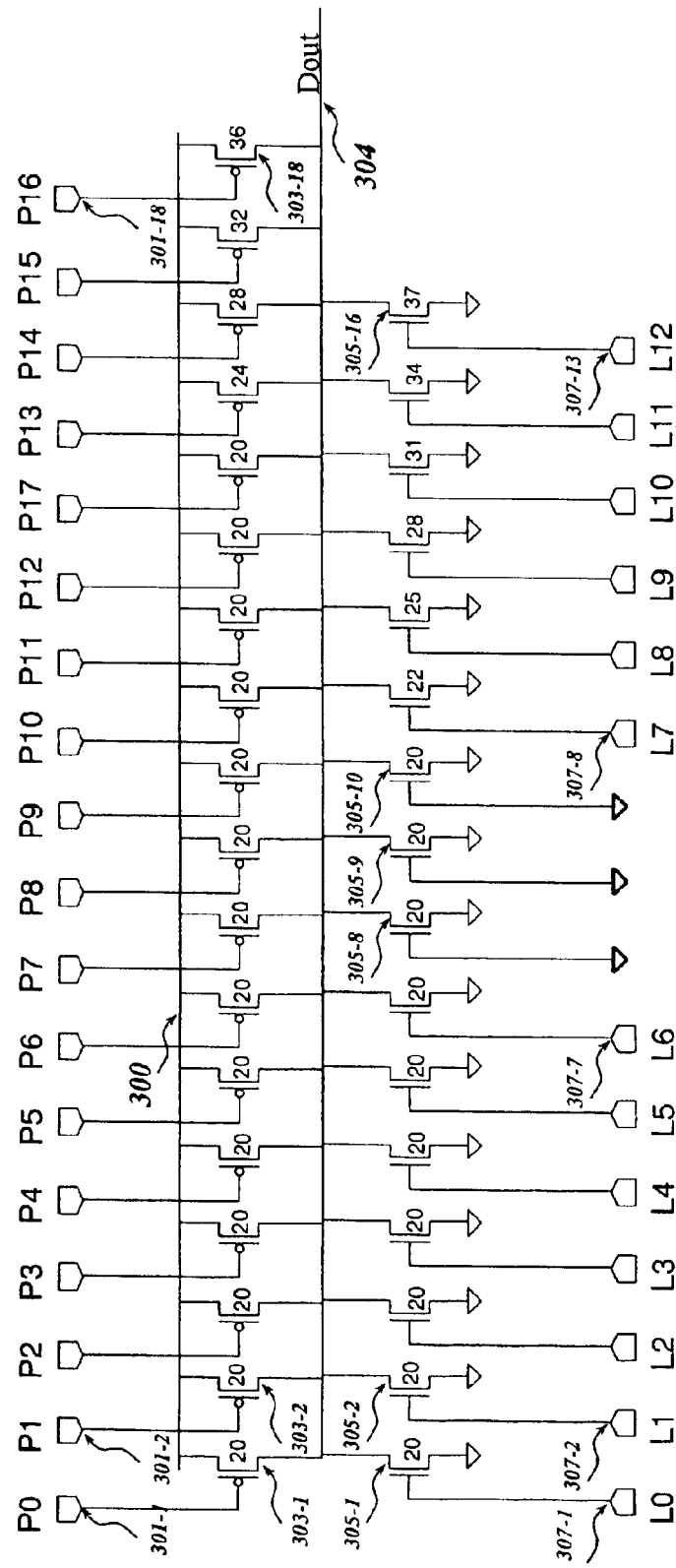
FIG. 3 shows the input/output buffer drive structure of this invention with a plurality of P-channel pull-up transistors connected in parallel on the chip between a high voltage source and a conductive line on the chip and a plurality of N-channel pull-down transistors connected in parallel on the chip between the conductive line on the chip and the system ground.

FIG. 3 illustrates schematically the circuitry of the input/output buffer drive structure of this invention. The structure includes a plurality of P type pull-up transistors, 303-1 through 303-18, each of which is connected respectively between high source voltage 300 and conductive lead 304 by a low voltage on its corresponding one of gate nodes 301-1 through 301-18.

During operation of the structure shown in FIG. 3, the gate nodes 301-1 through 301-18 will be selectively enabled to bring into operation in the circuit (i.e. to "turn-on") those selected ones of transistors 303-1 through 303-18 required to provide the proper input or output impedance of the programmable input/output buffer of which these transistors 303 are a part. The operation of these transistors during the receipt or transmission of a signal will be described below.

The structure in FIG. 3 also includes a plurality of N-channel pull-down transistors 305-1 through 305-16. During operation of the structure shown in FIG. 3, the gate nodes 307-1 through 307-13 will be selectively enabled to bring into operation in the circuit those selected ones of transistors 305-1 through 305-7 and 305-11 through 305-16 required to provide the proper input or output impedance of the programmable input/output buffer of which these transistors 305 are a part. The operation of these transistors during the receipt or transmission of a signal will be described below. N-channel transistors 305-8 through 305-10 have their gates connected permanently to ground. This insures that these three N-channel transistors will always be in the off condition and, therefore, not contribute to the input impedance seen by the signal coming in from the off-chip transmission line or to the output impedance of a low level signal to be transmitted from the chip through the output buffer to the off-chip transmission line. These unused transistors are provided to bring the total gate width and corresponding diode area of transistors 305-1 through 305-16 up to the minimum amount required for electrostatic discharge ESD protection, but these gates are not needed to provide the minimum impedance required in either input or output mode under worst case conditions (i.e., high temperature, low voltage, weak transistors).

The transistors 303 and 305 typically have a channel length larger than the channel length associated with NMOS and PMOS transistors internal to the chip used to carry out logic functions. In one embodiment, the channel length equals 0.35 microns for all devices within the input/output buffer drive structure. These devices typically have thicker gate oxide and deeper junctions than normal internal logical devices. In one embodiment, the internal logic devices have a 0.13 micron-channel length compared to the 0.35 micron-channel length for the input/output buffer drive transistors.

Read Out of Data

Data to be read out of the chip can be either high level or low level. When high level data is read out of the integrated circuit chip, selected ones of P-channel pull-up transistors 303-1 through 303-18 will be turned on to match the output impedance of the programmable input/output buffer shown in FIG. 3 to the impedance of the transmission line external to the chip. When a low level signal is being read out, selected ones of N-channel pull-down transistors 305-1 through 305-7 and 305-11 through 305-16 will be turned on to match the output impedance of the programmable input/output buffer to the impedance of the external transmission line. These operations are called "read" operations because signals are being read from the chip.

During all read operations, WOE will be held low. WNBn (FIG. 5) will be held high during read mode, enabling NAND portion 504 to be controlled by the read inputs through NOR portion 503. Since write output enable (WOE) will be low, write output enable bar (WOEB) will be high when the chip is in read mode, and thus the output signal WPn from NOR gate 402 (FIG. 4) will be low during read mode. This ensures that the output signal from AND portion 403 will control the output signal Pn from NOR portion 404.

During read mode, read output enable signal ROE will be high and read output enabled bar signal ROEB will be low. The high ROE signal enables NAND gate 501 (FIG. 5) to respond to the state of RCODEN. If RCODEN is high, RNBn is low, allowing the output signal Nn to respond to the data signal DOUTint. Similarly, low ROEB enables NOR gate 401 causing the output signal RPn from NOR gate 401 to be controlled by the state of signal RCODEPB. A low RCODEPB causes RPn to be high, thereby enabling AND gate 403 to pass a high level signal from DOUTint to one input lead of NOR gate 404. If DOUTint is high, then the output signal Pn from NOR gate 404 is low thereby to turn on a corresponding one of P-channel pull-up transistors 303-1 through 303-18, whereas if DOUTint is low then the output signal Pn from NOR gate 404 is high thereby to turn off or leave off a corresponding one of P-channel pull-up transistors 303-1 through 303-18.

Read Out of Low Level Data

The operation of the structure in FIG. 3 to read out a low level signal from an integrated circuit chip incorporating the structure of FIG. 3 will be explained first. During this operation, selected ones of N-channel pull-down transistors 305-1 through 305-7 and 305-11 through 305-16 will be turned on. The channel width in microns associated with a particular transistor 305 is given by the number adjacent to the channel of that transistor 305. Thus, devices 305-1 through 305-10 have channel widths of 20 microns, while devices 305-11 through 305-16 have channel widths of 22, 25, 28, 31, 34 and 37 microns, respectively. Should two transistors with the same channel widths be turned on during the driving from the chip of a low level output signal using the input/output buffer drive structure of this invention, then the impedance associated with the output drive structure will be one half the impedance that would be associated with this structure if only one of these two transistors 305 had been turned on. By controlling the number of transistors 305 turned on, the actual output impedance of the output buffer drive structure can be tailored to match as closely as possible the impedance of the transmission-channel to which the output signal is to be driven.

Figure 5:
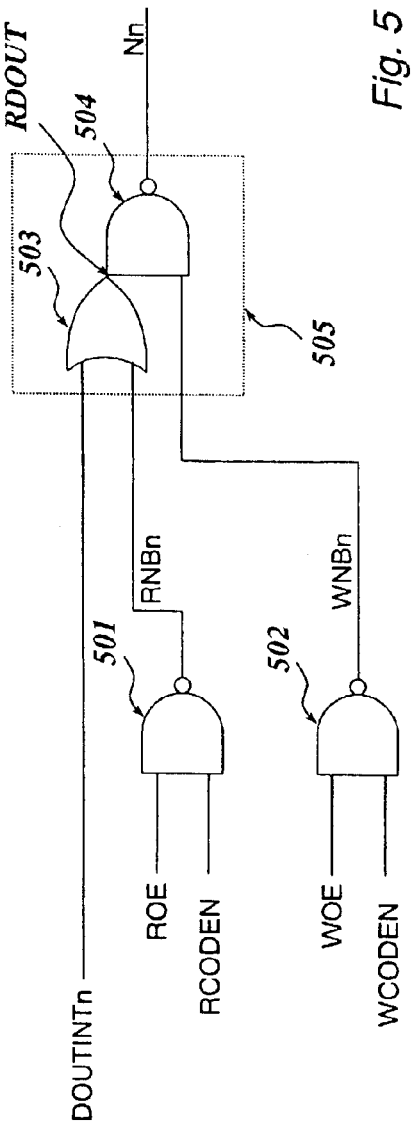
FIG. 5 shows the pre-driver logic for bit n of the pull-down transistors associated with the structure shown in FIG. 3 (where n is an integer which can assume any value between 1 to 7 and 11 to 16 to represent a selected one of the n-channel pull-down transistors 305-1 through 305-7 and 305-11 through 305-16).

FIG. 5 shows the structure used to provide the signal on one of terminals 307-1 through 307-13 in FIG. 3. The structure in FIG. 5 is replicated thirteen (13) times so that a logic circuit as shown in FIG. 5 is associated with each of N-channel pull-down transistors 305-1 through 305-7 and 305-11 through 305-16. The nth terminal (where n is an integer between 1 and 13) will receive either a high or a low signal. A high signal will turn on the corresponding N-channel pull-down transistor 305-n, thereby to place the impedance of this transistor in parallel with the impedances of all the other transistors 305 which are turned on so as to match as closely as possible the impedance of the transmission line. A low signal will leave off the corresponding transistor 305-n.

Thus, if a low-level signal is to be read out of the chip, then the read output enable signal ROE (active high) is applied to one input terminal of NAND gate 501 on all 13 pre-driver stages. During the read operation, WOE is low, thereby ensuring that the states of the output signals Pn from NOR gate 404 (FIG. 4) and Nn from NAND gate 504 (FIG. 5) are controlled in part by the signal DOUTint. A low write output enable signal WOE causes the output signal WNBn of NAND gate 502 to be high. Accordingly, the output signal Nn of complex gate 505 will be controlled by the states of the read operation input signals ROE, RCODEN and DOUTint. The signal RCODEN, applied to the other input terminal of NAND gate 501 on all 13 pre-driver stages, if high, causes NAND gate 501 to produce a low output signal RNBn. A low RNBn enables OR gate 503 to pass the DOUTint signal. Under this condition, a low DOUTint signal causes the output signal Nn from NAND gate 504 to be high and thus turn on the corresponding pull-down transistor 305-n (FIG. 3). The signal RCODEN is generated as will be described below in conjunction with FIG. 7.

When RCODEN is high (and there are thirteen signals RCODEN corresponding one-to-one to the thirteen N-channel pull-down transistor 305-1 to 305-7 and 305-11 to 305-16)the N-channel pull-down transistors 305 corresponding to the RCODEN high signals can be turned on by Nn high. Nn high is caused by DOUTint low causing the output signal RDOUT from OR portion 503 (FIG. 5) to be low. When signal Nn is high (corresponding to the signal DOUTint being low), then the corresponding N-channel transistor 305-n is turned on. As a result, the requisite number of N-channel pull-down transistors 305 will be turned on to cause the impedance of the output drive circuit to match the impedance of the off-chip transmission line, based on the 13 bits of read code RCODEN.

Read Out of High Level Data

If DOUTint is high, then complex gate 505 produces a low output signal Nn, thereby to leave off all transistors 305-1 to 305-7 and 305-11 to 305-16. This is as expected since a high output signal would not require any of the N-channel pull-down transistors 305-1 through 305-7 and 305-11 through 305-16 (FIG. 3) to be turned on, but, rather, would require selected ones of the P-channel pull-up transistors 303-1 through 303-18 to be turned on as will be described below. Accordingly, the high output signal RDOUT from OR portion 503 would be applied to one input lead of NAND portion 504. WOE being low causes the other input lead of NAND portion 504 to be high, thus ensuring that the output signal Nn from complex gate 505 will be low.

When the output signal DOUTint is high, a corresponding one or more of the pull-up transistors 303-1 through 303-18 will be turned on depending on the value of the 17 bits of read P-channel code RCODEPB, thereby to match the output pull-up impedance of the output buffer drive structure on the chip to the impedance of the off-chip transmission line. The circuit shown in FIG. 4 causes this to happen. Eighteen circuits of the type shown in FIG. 4 correspond to the 18 P-channel transistors 303-1 through 303-18 shown in FIG. 3. Each circuit of the type shown in FIG. 4 drives a corresponding one of these eighteen P-channel transistors 303.

In reading out a high level output signal DOUTint, signal WOEB (which is the complement of WOE) Is high. WOEB is applied to one input lead of NOR gate 402 thereby causing the output signal WPn, applied to one input lead of output NOR gate 404, to be low thereby enabling NOR gate 404. The signal ROEB (the complement of ROE) applied to one input lead of NOR gate 401 is low, thereby enabling NOR gate 401 to respond to the state of signal RCODEPB (to be generated as described below in conjunction with FIG. 9) to control the output signal RPn from NOR gate 401. Thus if RCODEPB is high (low) then the output signal RPn from NOR gate 401 is low (high). The high RPn applied to one input lead of AND gate 403 enables AND gate 403. Thus the state of AND gate 403 is then controlled by the level of DOUTint. Since DOUTint is high, the output signal from AND gate 403 is high and this signal applied to NOR gate 404, enabled by WPn low, causes the output signal Pn from NOR gate 404 to be low. Accordingly, the low output signal Pn turns on the corresponding P-channel pull-down transistor 303-n.

The particular P-channel transistors 303 turned on by the signals P1 through P18 will be just those required, based on which of the 18 values of RCODEPB are selected (low value), to cause the output impedance of the output buffer drive pull-up structure to match as closely as possible the impedance of the transmission line when the data out signal DOUT from output buffer drive structure is high.

If the data out signal DOUTInt is low, then the output signal RDOUT' from all eighteen (18) AND portions 403 will be low, thereby driving all output signals Pn from NOR portions 404 high, thereby ensuring that all the P-channel transistors 303 driven by the signals Pn remain off.

Writing of Data

Should data be written to the chip from the off-chip transmission line, then the read output enable signal ROE will be low and the write output enable signal WOE will be high. The low ROE signal causes output signal RNBn from NAND gate 501 (FIG. 5) to be high, thereby forcing the output signal RDOUT from OR portion 503 applied to one input lead of NAND portion 504 to be high. This enables the write path from the WNBn input to NAND portion 504.

The high write output enable signal WOE causes NAND gate 502 to pass the signal WCODEN, which will be either low or high depending on whether the corresponding N-channel transistor 305-n (FIG. 3) is to be off or on when creating the desired termination pull-down impedance (two times (2×) the transmission line impedance). If the signal WCODEN is low, the output signal WNBn from NAND gate 502 is high and the output signal Nn from NAND gate 504 will be low, thereby preventing the corresponding N-channel transistor 305-n from being turned on. If the signal WCODEN is high, then the output signal WNBn from NAND gate 502 will be low, thereby causing the output signal Nn from NAND gate 504 to be high, thereby turning on the corresponding pull-down transistor 305-n.

A separate circuit, as shown in FIG. 5, corresponds to each of the N-channel pull-down transistors 305-1 through 305-7 and 305-11 through 305-16 and is used to drive the corresponding N-channel pull-down transistor 305-n to either on or off depending on the signal WCODEN derived as will be described below from the structure of FIG. 6.

The low read output enable signal ROE causes the output signal ROEB to be high. ROEB high causes the output signal RPn from NOR gate 401 (FIG. 4) to be low, thereby causing the output signal from AND portion 403 of the complex structure made up of AND portion 403 and NOR portion 404 to be always low, enabling the write path into NOR portion 404. WOEB low enables the output signal from NOR gate 402 to be controlled by the state of signal WCODEPB, derived as will be described below from the structure of FIG. 8. The output signal from NOR gate 402 and thus WCODEPB controls the state of the output signal WPn from NOR gate 402. Thus when WCODEP is high, WCODEPB is low and the output signal Pn from NOR portion 404 is low, enabling the P-channel transistor 303-n.

Figure 4:
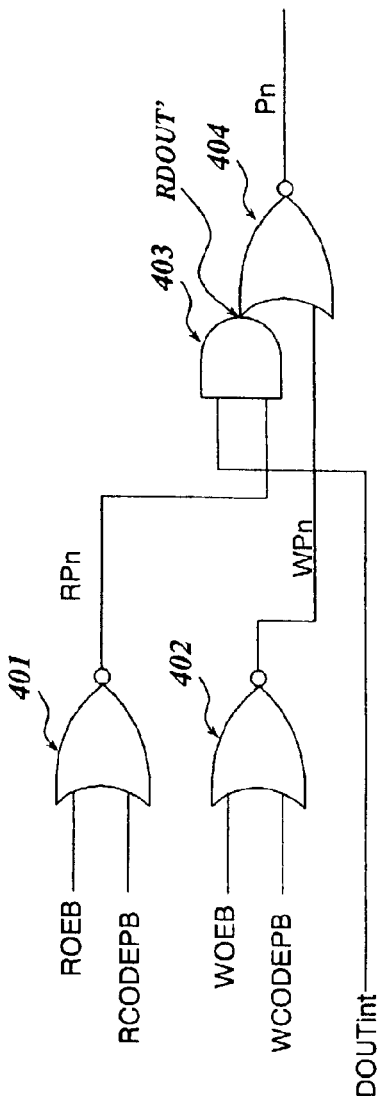
FIG. 4 shows the pre-driver logic for bit n of the pull-up transistors associated with the structure shown in FIG. 3 (where n is an integer which can assume any value between 1 and 18 to represent a selected one of the P-channel pull-up transistors 303-1 through 303-18).

Table 1 is the truth table for the structure of FIG. 5 and Table 2 is the truth table for the structure of FIG. 4. H means high, L means low and X means "don't care" in both truth tables.

TABLE 1

FIG. 5 - Pull-down Circuit

| | READ | | | | WRITE | | | |
|---|---|---|---|---|---|---|---|---|
| DOUTint | H | H | L | L | X | X | X | X |
| ROE | H | H | H | H | L | L | L | L |
| RCODEN | L | H | L | H | X | X | X | X |
| WOE | L | L | L | L | H | H | H | H |
| WCODEN | X | X | X | X | L | H | L | H |
| Nn | L | L | L | H | L | H | L | H |

TABLE 2

FIG. 4 Pull-up Circuit

| | READ | | | | WRITE | | | |
|---|---|---|---|---|---|---|---|---|
| DOUTint | H | H | L | L | X | X | X | X |
| ROEB | L | L | L | L | H | H | H | H |
| RCODEPB | L | H | L | H | X | X | X | X |
| WOEB | H | H | H | H | L | L | L | L |
| WCODEPB | X | X | X | X | L | H | L | H |
| Pn | L | H | H | H | L | H | L | H |

Generation of Control Signals WCODEN, RCODEN, WCODEP and RCODEP

FIGS. 6, 7, 8 and 9 show the circuitry for generating the code signals WCODEN, RCODEN, WCODEP and RCODEP, respectively. The signals WCODEPB and RCODEPB are the complements of WCODEP and RCODEP. The signals WCODEN and RCODEN represent the codes for write impedance and read impedance respectively, which are applied to the circuitry of FIG. 5 to develop signals to control N-channel transistors 305-1 through 305-7 and 305-11 through 305-16. The signals WCODEPB and RCODEPB represent the codes for write impedance and read impedance, respectively, which are applied to the circuitry of FIG. 4 to develop the signals to control P-channel transistors 303-1 through 303-18.

WCODEN will be used to set the input termination pull-down impedance and WCODEPB will be used to set the input termination pull-up impedance so that the parallel input impedance of the input/output structure will match the transmission line impedance at all times during a write operation. RCODEN will be used to match the output impedance of the output buffer pull-down drive structure to the impedance of the off-chip transmission line when the output signal being read from the chip is low level. RCODEPB will be used to match the output impedance of the output buffer pull-up drive structure to the impedance of the off chip transmission line when the output signal being read from the chip is high level.

The structures in FIGS. 6, 7, 8 and 9 are quite similar. Therefore, the structure shown in FIG. 6 will be described in detail. The structure shown in FIG. 7 works in a very similar way except for differences in component values and the value of the current from the current source.

Figure 6:
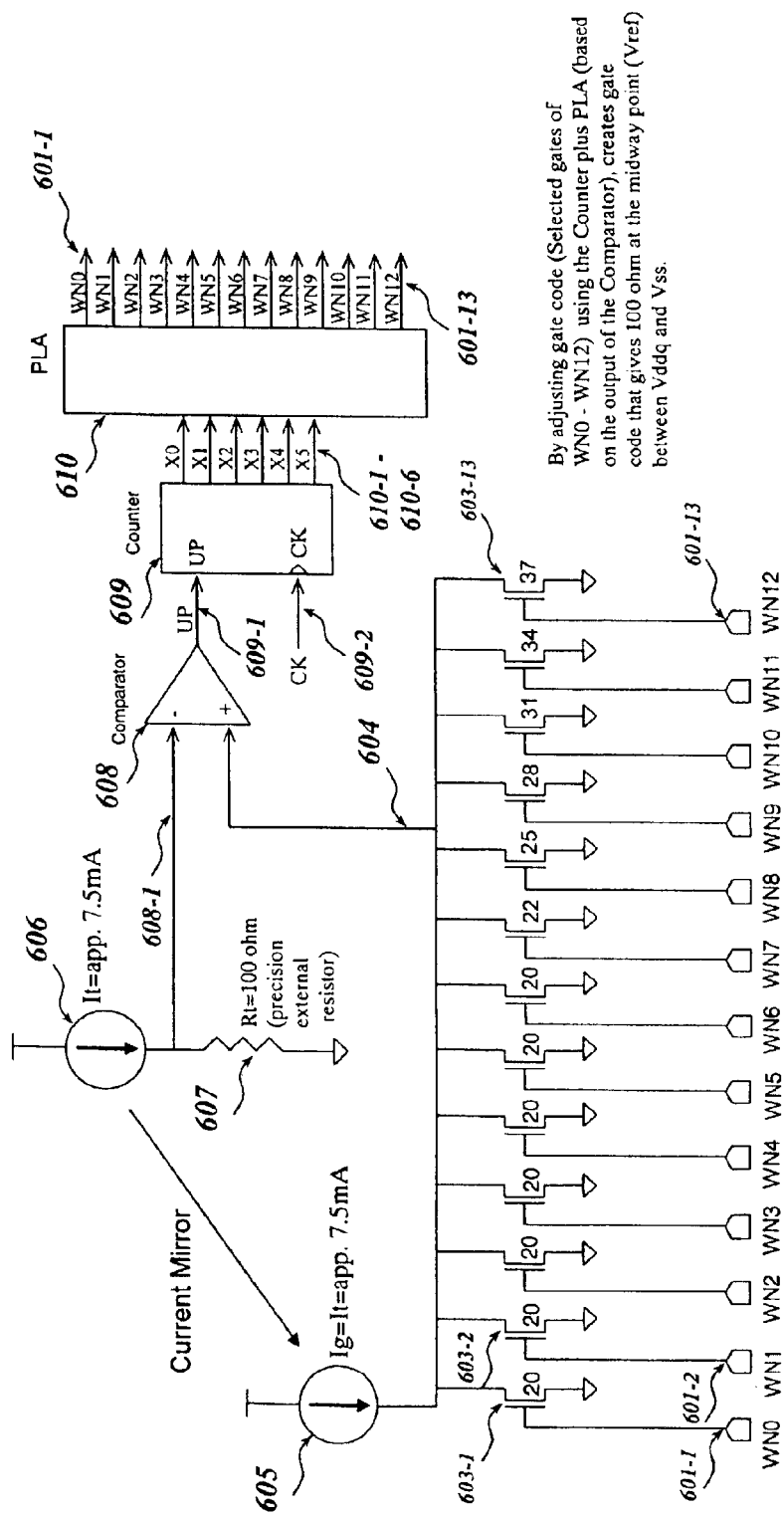
FIG. 6 shows the logic used to generate the signals WCODEN, used to activate the structure shown in FIG. 5 when data is to be written to the chip from an external transmission line.

Turning to FIG. 6, the code that will be used to generate each of the signals WCODEN (and there are in this embodiment thirteen such signals shown as signals WN0 through WN12 in FIG. 6) to be applied to a corresponding one of the bottom input leads of NAND gates 502 of the thirteen circuits of the type shown in FIG. 5 is generated by the structure of FIG. 6. The code generating structure comprises a counter 609 capable of counting up and down in binary from zero to 63 with all permutations in between. Counter 609 will produce six output signals X0 through X5 which will be transmitted to PLA 610. PLA 610 (shown in more detail in FIG. 11) converts the binary value represented by the signals X0 through X5 into binary values on the leads carrying the signals WN0 through WN12. These signals WN0 through WN12 are the same as the 13 WCODEN signals applied to one input lead of NAND gates 502 in the thirteen circuits of the type shown in FIG. 5. The total amount of gate width selected by the signals WN0–WN12 will monotonically increase as the binary count on X0–X5 increases. The thirteen leads carrying signals WN0–WN12 will have either a zero (a "low voltage") or a one (a "high voltage") on them, thereby to leave off or turn on, respectively, the corresponding N-channel transistors 603-1 through 603-13 by means of a corresponding signal applied to the gates of these 13 transistors from terminals 601-1 through 601-13. The transistors selected to be turned on from the set of transistors 603-1 through 603-13 will cause an output voltage to be produced on positive input lead 604 of comparator 608. The other input lead 608-1 of comparator 608 receives a voltage generated across resistor 607 (shown as a 100 ohm precision external resistor) by means of a 7.5 milliamp current from current source 606. If the voltage on positive input lead 604 of comparator 608 exceeds the voltage on lead 608-1, then the voltage on lead 604 must be reduced by reducing the impedance between lead 604 and ground. This impedance represents those of parallel-connected N-channel transistors 603-1 through 603-13 which have been selectively turned on by the signals WN0 through WN12 from PLA 610 applied to terminals 601-1 through 601-13, respectively. This impedance is reduced (increased) by turning on (off) an additional one or more of the transistors 603-1 through 603-13. A positive output signal from comparator 608 causes the counter 609 to count up while a negative output signal from comparator 608 causes the counter 609 to count down. The output signals X0 to X5 from counter 609 drive PLA610 which generates the code (i.e. the signals WN0 through WN12) from PLA 610 which determine which of transistors 603-1 through 603-13 are to be turned on to match the desired pull-down impedance (represented by the 100 ohm precision external resistor 607). This code is then used to drive the WCODEN input leads to the thirteen NAND gates 502 (FIG. 5) in the thirteen circuits used to generate the thirteen signals Nn which are applied to the thirteen terminals 307-1 through 307-13 (FIG. 3), respectively to control the pull-down transistor portion of the input impedance to the chip during a write operation. Thus the nth WCODEN lead in the circuit of FIG. 5 is driven by the corresponding signal WCODEN from the nth position of the code to ensure that the corresponding transistors 305-1 through 305-7 and 305-11 through 305-16 (FIG. 3) are turned on to match exactly (or as close thereto as possible) two times (2×) the impedance of the external transmission channel. Simultaneously, a similar operation is taking place using the structure of FIG. 8 to ensure that only a selected subset of P-channel transistors 803-1 through 803-18, which will likewise match the impedance of the 100 ohm precision external resistor 806, is being selected. The code WP0 through WP17 from PLA813 corresponding to the P-channel transistors 803-1 through 803-18 selected to be turned on can be applied as signals WCODEPB through the circuitry of FIG. 4 to generate signals P0 through P17 which are applied to terminals 301-1 through 301-18(FIG. 3) to turn on the corresponding subset of P-channel transistors 303-1 through 303-18 in the programmable input/output buffer to match exactly (or as close thereto as possible) two times (2×) the impedance of the external transmission channel.

Figure 8:
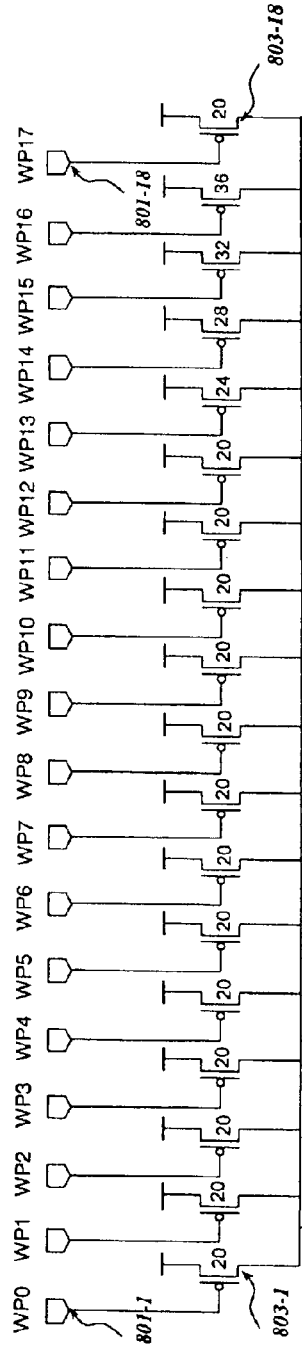
FIG. 8 shows the logic used to generate the signals WCODEP used to activate the structure shown in FIG. 4 when data is to be written to the chip from an external transmission line.
Figure 8:
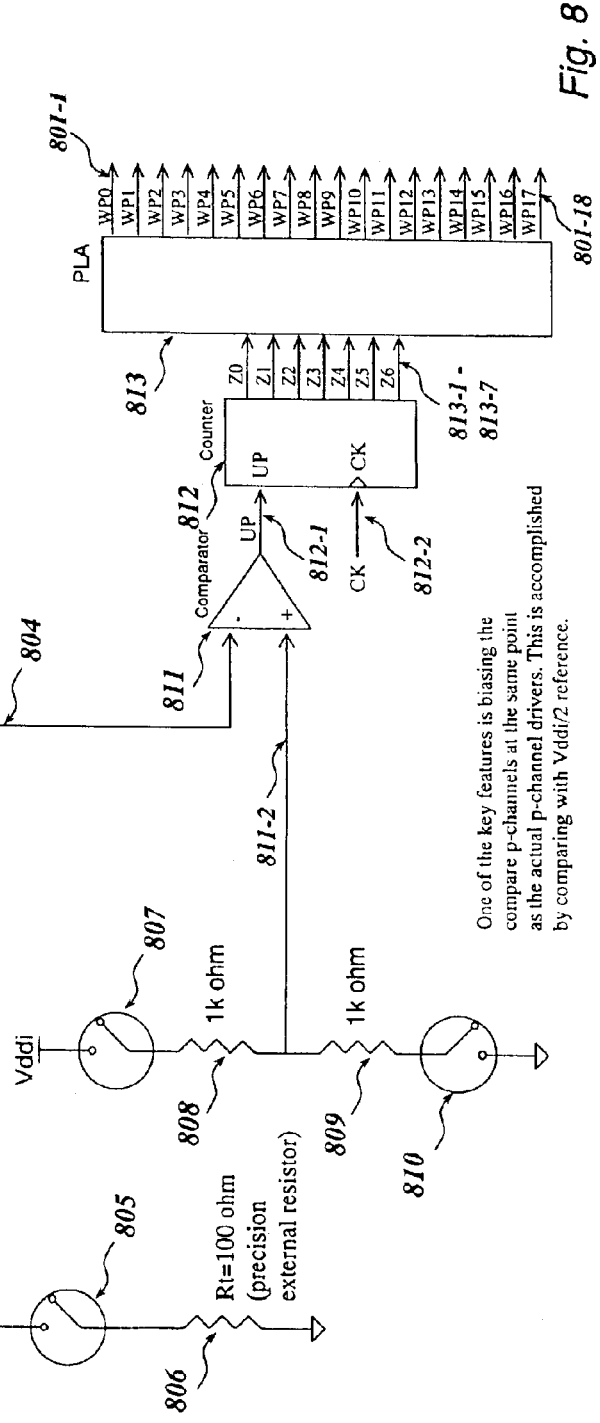

As shown in FIG. 8, P-channel transistors 803-1 through 803-18, which are the same structure (i.e. the same channel length and junction depths) as the P-channel transistors 303-1 through 303-18 in FIG. 3, have gates driven by signals applied to input terminals 801-1 through 801-18. Thus the signal on lead WP0 from PLA 813 is supplied to the input terminal 801-1 labeled WP0. Likewise, the signal WP17 is applied to the input terminal 801-18 labeled WP17. Thus a subset of P-channel transistors 803-1 through 803-18 can be turned on by a low level signal on the corresponding input terminals or left off by applying a high level signal to the corresponding input terminals. The voltage on the drain side of each of P-channel transistors 803-1 through 803-18 is determined by the current through the 100 ohms precision external resistor Rt 806. Current is allowed to flow through resistor 806 by closing switch 805. Once switch 805 is closed, current flows through the selected ones of transistors 803 which have been turned on by a low signal on the appropriate gates of transistors 803 and then through resistor 806. Thus the voltage on lead 804 connected to the drains of P-channel transistors 803 and to the negative input terminal of comparator 811 represents the voltage produced by the voltage divider. A precision Vddi/2 reference voltage applied to the positive input lead 811-2 of comparator 811 is generated by a voltage divider made up of series-connected 1K ohm precision resistor 808 and 1K ohm precision resistor 809, both connected between Vddi, the internal supply voltage, and ground, by switches 807 and 810, respectively. Switch 810 is connected between ground and resistor 809 and switch 807 is connected between the internal supply voltage Vddi and resistor 808. The use of a voltage divider as shown ensures that the reference voltage to comparator 811 causes the impedance of the turned-on ones of pull-up transistors 803-1 through 803-18 to match the 100 ohms precision external resistor 806 when the drains of transistors 803 are biased at Vddi/2, which is the critical point for sensing input voltages vs. Vref at Vddi/2.

The output voltage on lead 811-2 thus represents a reference voltage Vddi/2. The output signal from comparator 811 on lead 812-1 is applied to the up input lead of counter 812. A positive output signal from comparator 811 causes counter 812 to count up while a negative output signal from comparator 811 causes counter 812 to count down. Counter 812 produces seven output signals Z0 through Z6 on seven output leads which represent a 7 digit binary number between 0 and 127. The signals on the seven output leads are then passed to a programmable logic array (PLA) 813 which generates signals WP0 through WP17 on output leads 801-1 through 801-18. These signals are not only applied to terminals 801-1 through 801-18 in FIG. 8, but indirectly through the circuitry of FIG. 4 to nodes 301-1 through 301-18 in FIG. 3 to control P-channel pull-up transistors 303-1 through 303-18 in FIG. 3 in exactly the same manner as these signals control the P-channel pull-up transistors 803-1 through 803-18 in FIG. 8. The signals WP0 through WP17 produced from PLA 813 cause the turned-on ones of P-channel transistors 803-1 through 803-18 (FIG. 8) to produce the same impedance as the turned-on ones of P-channel transistors 303-1 through 303-018 in the input/output buffer circuitry (FIG. 3). This is accomplished by comparing in comparator 811 the voltage on input lead 804 to comparator 811 with the Vddi/2 reference voltage on positive input lead 811-2. The resulting P-channel structure in both FIG. 8 and FIG. 3 will have an impedance of 100 ohms at a drain voltage of Vddi/2, thereby to allow the programmable input/output buffer to have an effective impedance of 50 ohms (since selected ones of both the pull-up and pull-down transistors 303 and 305, respectively, are turned on during a write operation and appear to be connected in parallel to an AC input signal) in response to an input signal (either high or low) applied to the programmable input/output buffer shown in FIG. 3.

Figure 7:
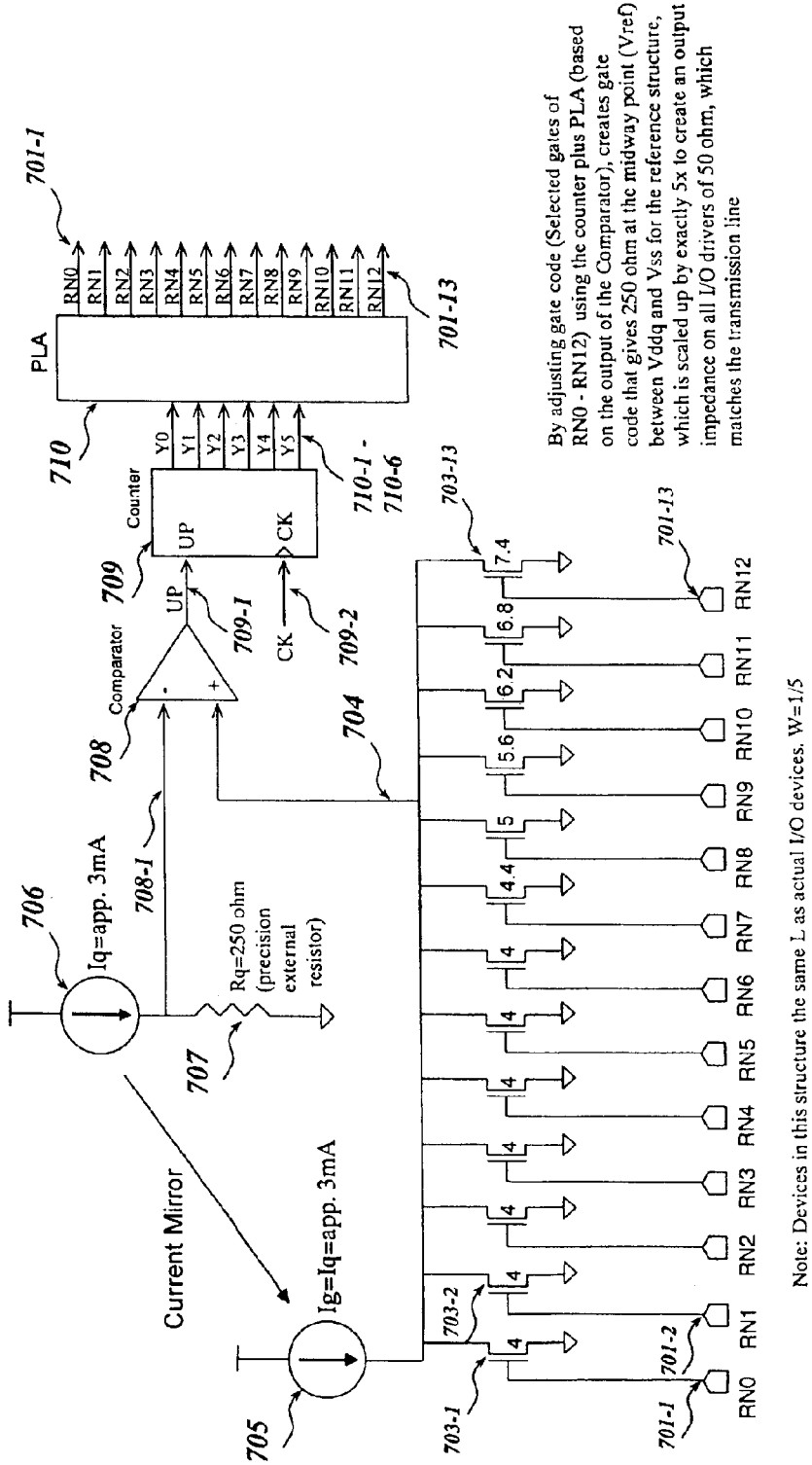
FIG. 7 shows the logic used to generate the signals RCODEN used to activate the structure shown in FIG. 5 when a low level signal is to be read from the chip and driven from the programmable input/output drive circuit to the external transmission line.
Figure 9:
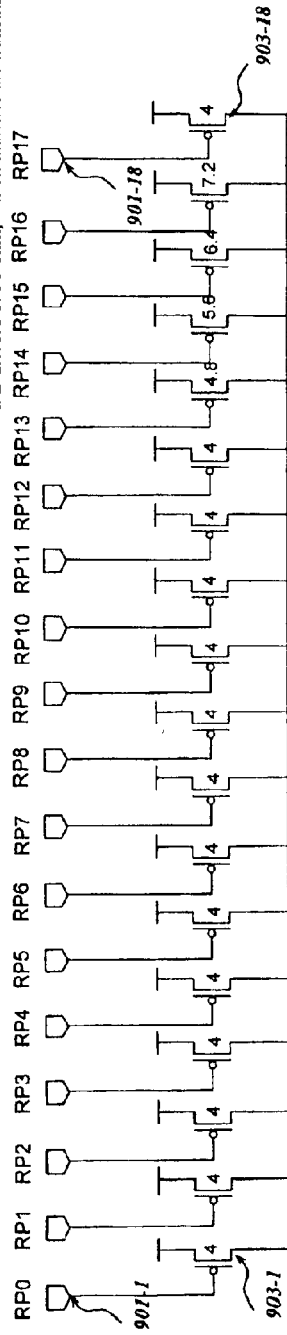
FIG. 9 shows the logic used to generate the signals RCODEP used to activate the structure shown in FIG. 4 when a high level signal is to be read from the chip and driven from the programmable input/output drive circuit to the external transmission line.
Figure 9:
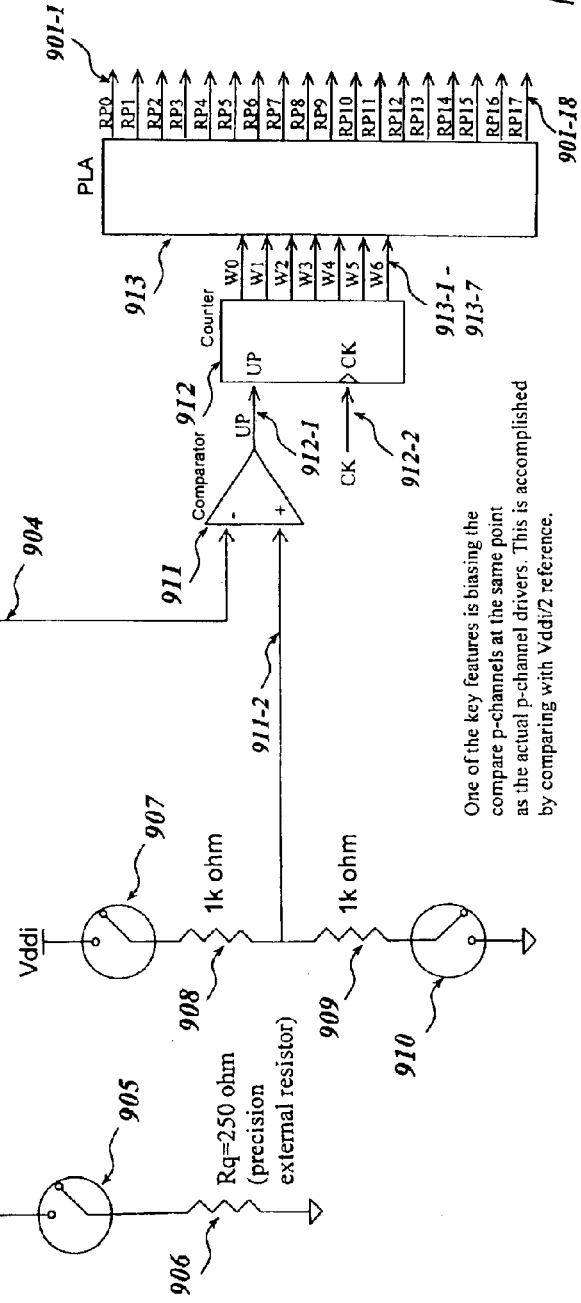

FIGS. 7 and 9 show the circuitry used to generate the signals RCODEN and RCODEP. The signals RCODEN are used to activate a subset of the thirteen N-channel MOS transistors 305-1 through 305-7 and 305-11 through 305-16 to provide a 50 ohms output impedance of the output buffer drive to match the impedance of the off-chip transmission line (which is assumed to have a 50 ohms impedance) for a low amplitude output signal from the integrated circuit chip. The signals RCODEP are used to generate the complementary signals RCODEPB which are used in conjunction with the eighteen circuits as shown in FIG. 4 to activate a subset of P-channel MOS transistors 303-1 through 303-18 (FIG. 3) required to provide a 50 ohms output buffer drive output impedance to match the impedance of the off-chip transmission line when the output data being transmitted from the chip is high level.

In FIG. 7, the current source 705 provides an approximately 3 milliamp current to N-channel transistors 703-1 through 703-13. Current source 706, identical to current source 705, provides an approximately 3 milliamp signal to 250 ohm precision external resistor 707, which is five times the impedance which will be desired for the particular subset of N-channel transistors 305-1 through 305-16 (FIG. 3), which will be activated to match the 50 ohm transmission line during the reading of the low level data signal from the integrated circuit chip. The widths of N-channel transistors 703-1 through 703-13 are made one-fifth the widths of the N-channel transistors 305-1 through 305-16 in the actual input/output buffer drive structure (FIG. 3). Therefore, the impedance associated with the subset of transistors 703-1 through 703-13 turned on by the signals RN0 through RN12 from PLA 710, which in turn are controlled by the signals Y0 through Y5 on leads 710-1 through 710-6, respectively, from counter 709, will be five times the impedance associated with the corresponding subset of N-channel transistors 305-1 through 305-16 turned on by the output signals Nn from the thirteen circuits of FIG. 5 controlled by the signals RN0 through RN12 (applied in each such circuit to the input lead carrying the signal RCODEN to NAND gate 501). The comparator 708 compares the voltage on input lead 708-1 (generated by an approximately 3 mA current from current source 706 through 250 ohm precision external resistor 707) to the voltage on positive input lead 704. A positive signal from comparator 708 causes counter 709 to count up and a negative signal from X comparator 708 causes counter 709 to count down. The output signals Y0 through Y5 from counter 709 represent the binary count and are applied to PLA 710. PLA 710 then generates the appropriate output signals RN0 through RN12 (corresponding to the thirteen RCODEN signals which drive the thirteen circuits as shown in FIG. 5). The thirteen circuits of the type shown in FIG. 5 drive the thirteen N-channel pull-down transistors 305-1 through 305-7 and 305-11 through 305-16 (FIG. 3) using the signals N0 through N13 from complex gates 505. The code output signals RN0 through RN12 from PLA 710 are also applied to terminals 701-1 through 701-13 (FIG. 7) to cause comparator 708 to continuously count up and down around the count which turns on the subsets of transistors 703-1 through 703-13 which create the required impedance. The codes from PLA 710 which cause the output signal from comparator 708 to cycle the least significant bit Y0 continuously from positive to negative to positive represent a steady state and are used to activate the corresponding subsets of N-channel transistors 305-1 through 305-7 and 305-11 through 305-16 (FIG. 3) which represent two impedances bracketing the impedance of precision external resistor 707. This causes the output driver circuit to have an output impedance matching the 50 ohm output impedance of the transmission line off-chip within the resolution of the least significant bit when the output data signal is low level.

FIG. 9 shows the similar structure for generating the code RP0 through RP17. This code corresponds to the signals RCODEP from which the complementary eighteen signals RCODEPB applied to one input lead of NOR gate 401 in the eighteen circuits of the type shown in FIG. 4 are generated. These signals control the signals P0 through P18 used to drive terminals 301-1 through 301-18 (FIG. 3) associated with the P-channel pull-up transistors 303-1 through 303-18 (FIG. 3). As in the voltage divider of FIG. 8, a current is passed through the series connected switch 907, 1K ohm resistor 908, 1K ohm resistor 909 and switch 910, to provide the output signal Vddi/2 on positive input lead 911-2 to comparator 911. Input lead 904 to comparator 911 carries the voltage corresponding to the voltage on the drains of P-channel transistors 903-1 through 903-18. When the impedance for the turned-on ones of transistors 903 is 250 ohms, the voltage on lead 904 is Vddi/2 due to the resistive divider between transistors 903 and the 250 ohm resistor 906. The current through selected ones of P-channel transistors 903-1 through 903-18 is controlled by applying coded signals RP0 through RP17 output from PLA 913 to the input leads to transistors 903. These coded signals RP0 through RP17 are also inverted and applied to the RCODEPB input lead to NOR gate 401 in each of the eighteen circuits of the type shown in FIG. 4. The eighteen circuits of the type shown in FIG. 4 then generate the signals P0 through P17 which turn on selected ones of the P-channel pull-up transistors 303 corresponding to the turned-on ones of P-channel pull-up transistors 903. Coded signals RP0 through RP17 are generated by PLA 913 from signals W0 through W6 on leads 913-1 to 913-7 from counter 912 driven by comparator 911 and are sent to the gates 901-1 through 901-18 of corresponding P-channel pull-up transistors 903-1 through 903-18. Each particular subset of P-channel pull-up transistors 903-1 through 903-18 yields a voltage on node 904 which when compared to the reference voltage on positive input lead 911-2 to comparator 911 causes comparator 911 to either count up (a positive output signal from comparator 911) or down (a negative output signal from comparator 911). The codes, represented by the signals on terminals 901-1 through 901-18, which cause counter 912 to count either up or down, represent the subsets of transistors 903-1 through 903-18 which have impedances most closely matching the impedance of resistor 906. The signals RP0 through RP17 are the signals RCODEP from which the signals RCODEPB (the complements of RCODEP) are generated and used, as described above in conjunction with FIG. 4, to generate the signals P0 through P17 which drive the corresponding gates on the corresponding P-channel pull-up transistors 303-1 through 303-18 (FIG. 3). Accordingly, during the transmission of a high level output data signal from the integrated circuit chip to an off-chip transmission line, the impedance of the output buffer drive structure of FIG. 3 matches most closely the impedance of the 50 ohm transmission line FIG. 10a and 10b are matrices showing along the right side Y axis the total channel widths associated with a particular subset of the N-channel pull-down transistors 305 and the P-channel pull-up transistors 303, respectively, shown in FIG. 3, and showing along the X axis the channel width of each transistor 305-n and 303-n, respectively. The channel widths range from 20 microns up to 37 microns for the individual N-channel transistors 305 and from 20 microns to 36 microns for the individual P-channel transistors 303. Each matrix identifies the transistors that will be turned on to achieve the total channel width effective in setting the impedance of the input/output buffer as set forth in the vertical column labeled "Total". The top portions of FIG. 10a and 10b show the channel widths of the individual N-channel devices and the P-channel devices, respectively.

The total number of N-channel pull-down transistors (including selected and unselected transistors) should give a combined channel width somewhere between 360 and 400 microns. Any lower total combined channel width increases the risk of damage due to electrostatic discharge while any higher total width causes excessive capacitance and slows down the operation of the circuit of which the buffers are a part. The target for the total widths of the P-channel pull-up transistors is also somewhere between 360 to 400 microns for the same reasons. Note that the sum of the channel widths of all transistors, whether turned on or not, is effective in providing protection against electrostatic discharge ("ESD") while only the turned-on transistors contribute to, and thus control the impedance of, the input/output buffer.

FIG. 10a shows in the left hand vertical column the count from counter 609 in FIG. 6 or from counter 709 in FIG. 7 and shows in the right hand vertical column the total channel width of the selected transistors 305-1 through 305-7 and 305-11 through 305-16 introduced into the circuit in response to the signals WN0 through WN12 generated by PLA 610 in FIG. 6 or in response to the signals RN0 through RN12 generated by PLA 710 in FIG. 7. Both the channel widths of the respective transistors to be turned on and the signals WN0 through WN12 or RN0 through RN12 which turn on these transistors 305 (in write mode or read mode, respectively) are depicted horizontally across the top of FIG. 10a. Within the body of FIG. 10a is a matrix of "1s" and blank spaces (i.e. "0s") placed in columns. A "1" at a given location indicates that the output signal WNX or RNX enabling the transistor 305 identified at the top of that column is the level (for an N-channel transistor a high level and for a P-channel transistor a low level) required to turn on that transistor. The absence of a one in a column indicates that the output signal driving the transistor identified at the head of that column is not the level required to turn on that transistor.

FIG. 10b similarly shows in the left hand vertical column the numbers 0 through 80 corresponding to the 81 word lines in PLAs 813 (FIG. 8) and 913 (FIG. 9) and corresponding to 81 of the 128 numbers capable of being generated by counter 812 in FIG. 8 and counter 912 in FIG. 9. The right hand vertical column corresponds to the total channel width of the subset of the P-channel transistors 303-1 through 303-18 capable of being enabled by the signals WP0 through WP17 or RP0 through RP17. Each of these signals is identified with a column in FIG. 10b. Thus, signal RP0 and signal WP0 head up the first column on the left representing a transistor channel width. The total width of the channels of the transistors turned on by a particular combination of signals WP0 through WP17 or RP0 through RP17 is shown in the rightmost column. The sum of the channel widths of the subset of P-channel pull-up transistors 303-1 through 303-18 turned on by the low level signals represented by a "1" in the respective columns of each row shown in FIG. 10b is represented in the rightmost column. The binary 1 in a given column means that the corresponding transistor at the head of that column is turned on by the signal identified at the head of that column. Thus, for example in line 80, only the transistors in the columns driven by the signals WP0 and WP1 or RP0 and RP1 are left off and all other transistors are turned on for a total enabled channel width of 360 $\mu$m.

FIGS. 10a and 10b show the truth tables for the PLA devices in FIGS. 6, 7, 8 and 9. The PLA 610 and the PLA 710 in FIGS. 6 and 7, respectively, are represented by the truth table in FIG. 10a while the PLA 813 and the PLA 913 in FIGS. 8 and 9, respectively, are represented by the truth table in FIG. 10b.

Figure 11:
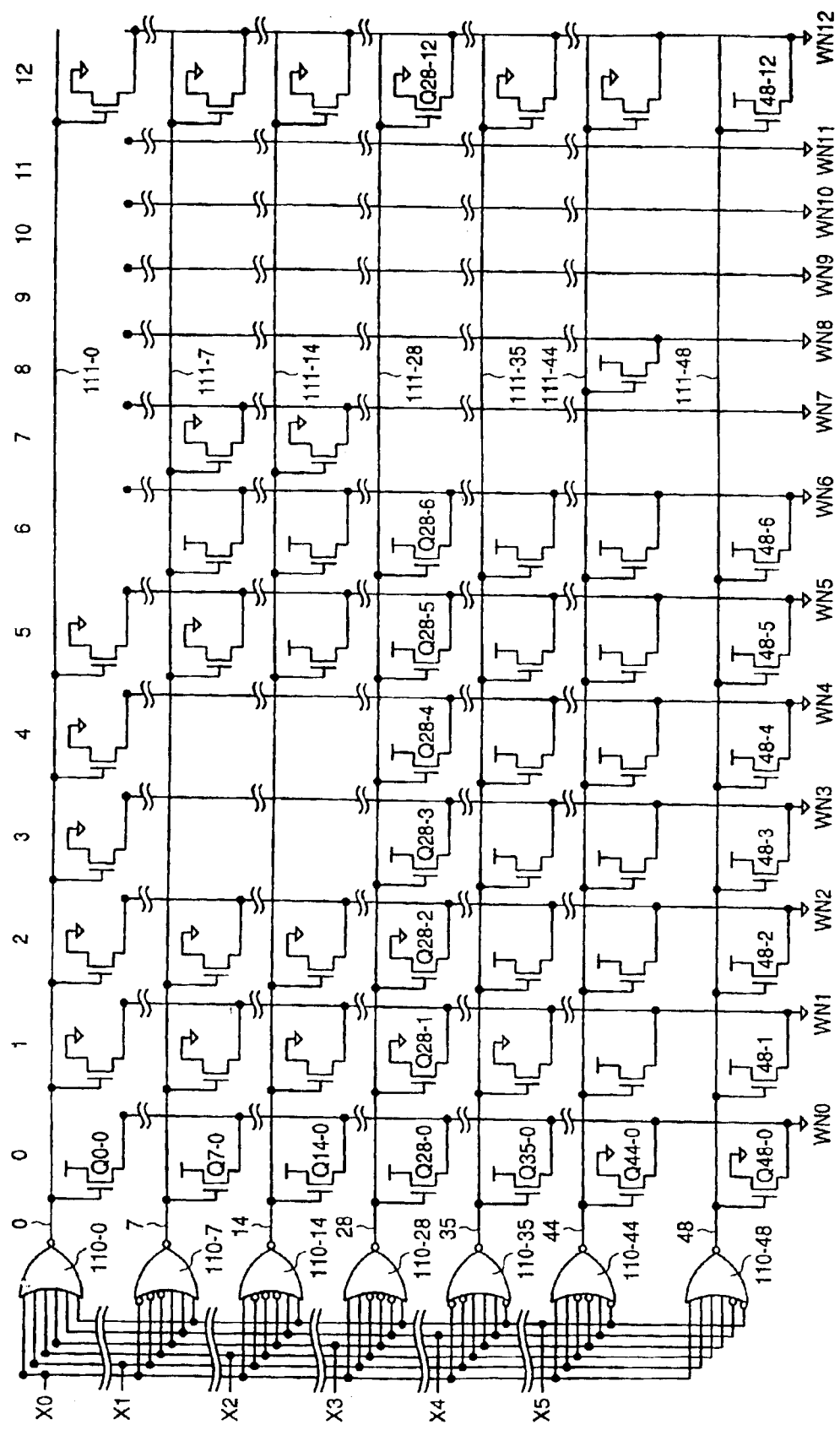
FIG. 11 shows the structure of PLAs 610 and 710.

The structure of a programmable logic array ("PLA") of the type suitable for implementing PLAs 610 and 710 is shown in FIG. 11. A similar but larger (i.e. more columns (18) and rows (81)) PLA structure but appropriately programmed can be used to implement the PLAs 813 and 913 shown in FIGS. 8 and 9. The PLA in FIG. 11 contains 49 rows (rows 111-0 through 111-48) of which only rows 111-0, 111-7, 111-14, 111-28, 111-35, 111-44 and 111-48 are shown. Other rows will be programmed in a manner similar to the rows shown to produce the correct drive signals WN0 through WN12 from PLA 610 (FIG. 6) or the correct drive signals RN0 through RN12 from PLA 710 (FIG. 7). Thus, for example, row 111-28, when activated by a high level signal on conductive line 111-28, generates high level output signals WN0, WN3, WN4, WN5 and WN6 or RN0, RN3, RN4, RN5 and RN6. Thus, when number 28 (011100) is applied to the six input leads X5, X4, X3, X2, X1 and X0 of NOR gate 110-28, the output signal from NOR gate 110-28 will be high level. The output signals from all the other NOR gates 110-0 through 110-27 and 110-29 through 110-49 will be low level. The high level signal from NOR gate 110-28 will then turn on each N channel transistor 28 the gate of which is connected to the row line 111-28 and the source of which is connected to the output bit line WNX. The drain of each transistor to drive WNX to the high level is connected to the internal supply voltage, thus insuring that when a high voltage output signal from NOR gate 110-28 on row line 111-28 is applied to the gate of transistor 28-0, and N channel transistor 28-0 is connected to Vdd, the signal on line WN0 is high. All other transistors connected to bit line WN0 remain off since the output signals from the NOR gates 110 which drive the appropriate word lines 111 connected to the gates of these other transistors all remain low.

Referring to FIG. 10a, this figure shows that the other signals which must be generated when the word line 111-28 goes high are the signals WN3, WN4, W5 and WN6. These signals are then generated by transistors 28-3, 28-4, 28-5 and 28-6, each of which has its drain connected to the supply voltage $V_{CC}$. The source of each of these four transistors is connected, respectively, to the output bit lines WN3, WN4, WN5 and WN6. Each of these lines therefore will produce a high level signal in response to the word line 111-28 being driven high by the binary count 011100 being applied to the six input leads of NOR gate 110-28. The other transistors connected to word line 111-28, as shown by exemplary transistors 28-1, 28-2 and 28-12, for example, have their drains connected to ground so that the output signals on the output lines WN1, WN2 and WN12 connected to the sources of these transistors will all be low level or ground when word line 111-28 is selected.

The other rows in the PLA 610 or the PLA 710 are programmed in a similar manner to produce the output signals as indicated by the ones shown in FIG. 10a. For example, row 48 corresponding to word line 111-48 has N channel transistors 48-1, 48-2, 48-3, 48-4, 48-5, 48-6 and 48-12 connected such that their drains are connected to the supply voltage $V_{CC}$ and their sources connected to corresponding bit lines WN-1 through WN-6 and WN-12, respectively. Thus when word line 111-48 is driven high, these seven transistors provide high level output signals on their corresponding output lines (i.e., bit lines) WN-1 through WN-6 and WN12 while the other N channel transistors, the gates of which are connected to word line 111-48, have their drains connected to ground and thus provide low level output signals.

A similar structure is fabricated comprising 81 rows and 18 columns to implement the PLA structure required by the truth table shown in FIG. 10b. The NOR gates used to drive the 81 word lines each have seven input leads, but the structure is implemented in the same manner as is the structure shown in FIG. 11. For simplicity, this structure will not be shown but those skilled in the art will recognize that this structure is implemented using the truth table of FIG. 10b in the same manner as is the structure shown in FIG. 11 using the truth table of FIG. 10a.

The total impedance introduced into the input/output buffer by the output signals from the PLAs 610 and 710 in FIGS. 6 and 7 is represented by the total channel widths introduced by turning on the N-channel pull-down transistors 305-1 through 305-7 and 305-11 through 305-16 connected to receive signals derived from the signals WN0 through WN12 or from the signals RN0 through RN12.

The total impedance introduced into the input/output buffer by the signals from the PLAs 813 and 913 in FIGS. 8 and 9 is represented by the total channel widths introduced by turning on the P-channel pull-up transistors 303-1 through 303-18 turned on by signals derived from the signals WP0 through WP17 or RP0 through RP17 respectively.

Thus, by turning on selected combinations of these transistors, impedances corresponding to channel widths varying from 20 to 157 μm for the transistors 305-1 through 305-7 and 305-11 through 305-16 can be obtained. Likewise, impedances corresponding to channel widths varying from 40 μm through 360 μm are obtained from transistors 303-1 through 303-18.

Different combinations of transistors in the I/O buffer shown in FIG. 3 can be used as can different channel widths depending upon the system requirements. As a feature of this invention, the impedance of the I/O buffer is constantly being matched to the impedance of the input transmission line or to the impedance of the output transmission line through the continuous operation of the circuits shown in FIGS. 6, 7, 8 and 9.

Other embodiments of this invention will be obvious to those skilled in the circuit design arts in view of this disclosure.

What is claimed is:

1. A programmable input/output circuit on an integrated circuit chip comprising:
    a first plurality of transistors connected between a supply voltage and a conductive lead on said integrated circuit chip;
    a second plurality of transistors connected between said conductive lead and ground, wherein said second plurality of transistors comprises pull-down transistors, and wherein said second plurality of transistors includes at least one pull-down transistor which is not capable of being turned on during the operation of said input/output circuit;
    circuitry for turning on a first selected set of said first plurality of transistors;
    circuitry for turning on a second selected set of said second plurality of transistors;
    circuitry to allow said first selected set of said first plurality of transistors to be turned on only when a data output signal of a first value is being sent from said integrated circuit chip to an external transmission line; and
    circuitry to allow said second selected set of said second plurality of transistors to be turned on only when a data output signal of a second value is being sent from said integrated circuit chip to an external transmission line.

2. A programmable input/output circuit on an integrated circuit chip comprising:
    a first plurality of transistors connected between a supply voltage and a conductive lead on said integrated circuit chip;
    a second plurality of transistors connected between said conductive lead and ground, wherein said second plurality of transistors comprises pull-down transistors, and wherein said second plurality of transistors includes at least two pull-down transistors not capable of being turned on during operation of said input/output circuit;
    circuitry for turning on a first selected set of said first plurality of transistors;
    circuitry for turning on a second selected set of said second plurality of transistors;
    circuitry to allow said first selected set of said first plurality of transistors to be turned on only when a data output signal of a first value is being sent from said integrated circuit chip to an external transmission line; and
    circuitry to allow said second selected set of said second plurality of transistors to be turned on only when a data output signal of a second value is being sent from said integrated circuit chip to an external transmission line.

3. Structure for generating a first plurality of signals for controlling the impedance of a programmable input/output buffer on an integrated circuit chip which comprises:
    a precision resistor;
    a first current source for providing a current through said precision resistor;
    a plurality of reference pull-down transistors corresponding to a plurality of pull-down transistors within said programmable input/output buffer;
    a second current source for providing a current through a selected number of said plurality of reference pull-down transistors;
    a comparator having a first input lead connected to receive a signal representing the voltage across said first precision resistor generated by current from said first current source passing through said first precision resistor and a second input lead connected to receive a signal representing the voltage across said plurality of reference pull-down transistors generated by current from said second current source passing through said selected number of said second plurality of reference pull-down transistors, said comparator producing an output signal having a first polarity or a second polarity as a function of the relative values of the signals on said first and second input leads;
    a counter, responsive to the output signal from said comparator and driven by an input clock signal, for producing output signals representing a count, said count increasing in response to said output signal being of said first polarity and decreasing in response to said output signal being of said second polarity; and
    a logic circuit for receiving said output signals from said counter and for producing in response thereto drive signals to turn on said selected number of said plurality of reference pull-down transistors.

4. Structure as in claim 3 wherein said second current source mirrors said first current source.

5. Structure as in claim 3 wherein said comparator produces an output signal which causes said counter to decrease count when the subset of said first plurality of pull-down transistors turned on by the output signals from said logic circuit is such as to produce an output voltage beneath the mid-point between a supply voltage and a reference voltage and which causes said counter to increase the count when the subset of said first plurality of pull-down transistors turned on by the output signals from said logic circuit is such as to produce an output voltage above said midpoint.

6. Structure as in claim 3 wherein said logic circuit is a programmable logic array possessing a plurality of output leads.

7. Structure as in claim 6 wherein each output lead from said programmable logic array is connected to a corresponding one of said first plurality of reference pull-down transistors.

8. Structure as in claim 7 wherein each of said first plurality of reference pull-down transistors has a source connected to said system reference voltage, a gate connected to a corresponding one of said output leads from said logic circuit and a drain connected with the drains of all the other pull-down transistors to the negative input terminal of said comparator.

9. Structure as in claim 8 wherein the positive input terminal of said comparator is connected to a node between said first current source and said precision resistor.

10. Structure as in claim 9 wherein said precision resistor has a selected impedance approximately twice the impedance of a transmission line external to said integrated circuit chip which will be connected to said programmable input/output buffer.

11. Structure as in claim 10 wherein each of said plurality of reference pull-down transistors corresponds to a pull-down transistor in said programmable input/output buffer.

12. Structure as in claim 11 wherein said logic circuit generates signals used to control the impedance of said programmable input/output buffer during the writing of data to said integrated circuit chip.

13. Structure as in claim 12 wherein said logic circuit generates signals used to control the impedance of said programmable input/output buffer during the reading of data from said integrated circuit chip.

14. Structure for generating a first plurality of signals for controlling the impedance of a programmable input/output buffer on an integrated circuit chip which comprises:

two precision resistors series-connected between a supply voltage and ground;

a first current switch between said supply voltage and said two precision resistors;

a second current switch between said two precision resistors and ground;

a third precision resistor having two terminals, one terminal connected to ground;

a third current switch connecting the other terminal of said third precision resistor to a selected terminal on each of a plurality of reference pull-up transistors;

a plurality of reference pull-up transistors corresponding to a plurality of pull-up transistors within said programmable input/output buffer, said reference pull-up transistors being connected between said supply voltage and said third current switch;

a comparator having a first input lead connected to receive a signal representing the voltage at a first node between said two series-connected precision resistors and a second input lead connected to receive a signal representing the voltage at a second node between said plurality of reference pull-up transistors and said third precision resistor generated by current passing through a selected number of said plurality of reference pull-up transistors, said comparator producing an output signal having a first polarity or a second polarity as a function of the relative values of the signals on said first and second input leads;

a counter, responsive to the output signal from said comparator and driven by an input clock signal, for producing output signals representing a count, said count increasing in response to said output signal being of said first polarity and decreasing in response to said output signal being of said second polarity; and a logic circuit for receiving said output signals from said counter and for producing in response thereto drive signals to turn on said selected number of said plurality of reference pull-up transistors.

15. Structure as in claim 14 wherein said comparator produces an output signal which causes said counter to decrease count when the subset of said first plurality of pull-up transistors turned on by the output signals from said logic circuit is such as to produce a voltage on said second node above the voltage on said first node and which causes said counter to increase the count when the subset of said first plurality of pull-up transistors turned on by the output signals from said logic circuit is such as to produce voltage on said second node below the voltage on said first node.

16. Structure as in claim 14 wherein said logic circuit is a programmable logic array possessing a plurality of output leads.

17. Structure as in claim 16 wherein each output lead from said programmable logic array is connected to a corresponding one of said first plurality of reference pull-up transistors.

18. Structure as in claim 17 wherein each of said first plurality of reference pull-up transistors has a source connected to said supply voltage, a gate connected to a corresponding one of said output leads from said logic circuit and a drain connected with the drains of all the other pull-up transistors to the positive input terminal of said comparator.

19. Structure as in claim 18 wherein the negative input terminal of said comparator is connected to said first node.

20. Structure as in claim 19 wherein said third precision resistor has a selected impedance approximately twice the impedance of a transmission line external to said integrated circuit chip which will be connected to said programmable input/output buffer.

21. Structure as in claim 20 wherein each of said plurality of reference pull-up transistors corresponds to a pull-up transistor in said programmable input/output buffer.

22. Structure as in claim 21 wherein said logic circuit generates signals used to control the impedance of said programmable input/output buffer during the writing of data to said integrated circuit chip.

23. Structure as in claim 22 wherein said logic circuit generates signals used to control the impedance of said programmable input/output buffer during the reading of data from said integrated circuit chip.

24. Structure for controlling generation of signals for turning on a selected number of pull-up transistors in a programmable input/output buffer, said input/output buffer including a first plurality of pull-up transistors and a second plurality of pull-down transistors, comprising:

a comparator containing a positive input lead, a negative input lead and an output lead;

a counter connected to the output lead from said comparator for receiving an output signal from said comparator and for counting up in response to a first polarity output signal from said comparator and for counting down in response to a second polarity output signal from said comparator;

a programmable logic array driven by the output signals from said counter, said programmable logic array being capable of producing a first plurality of output signals, each of said first plurality of output signals being adapted to drive the gate of a corresponding one of a first plurality of compare pull-up transistors corresponding on a one-to-one basis to said first plurality of pull-up transistors in said input/output buffer;

a voltage divider connected between a supply voltage and ground, said voltage divider providing an output voltage equal to one-half said supply voltage; and a precision resistor of a selected value connectible to one terminal of each of said first plurality of compare pull-up transistors, said one terminal of each of said first plurality of compare pull-up transistors also being connected to the negative input terminal of said comparator.

25. Structure as in claim 24 wherein said precision resistor is connected to one terminal of each of said first plurality of compare pull-up transistors.

26. Structure as in claim 25 wherein said comparator produces a substantially zero output signal when the voltage drop across a selected set of said first plurality of compare pull-up transistors is equal to the voltage drop across said precision resistor.

27. Structure as in claim 26 wherein said first polarity output signal is a positive output signal and said second polarity output signal is a negative output signal.

28. Structure as in claim 26 wherein said structure is formed on an integrated circuit chip.

29. Structure as in claim 25 wherein the impedance of said first plurality of compare pull-up transistors substantially matches the impedance of said precision resistor when said comparator produces a substantially zero output signal.

30. Structure as in claim 24 wherein said first plurality of compare pull-up transistors are p-channel transistors.

31. Structure as in claim 24 wherein said programmable logic array comprises:

a plurality of word lines, each word line responding to a corresponding count from said counter, logic circuitry for activating a word line in response to a corresponding count from said counter, and a multiplicity of bit lines, each bit line being connected by a plurality of transistors connected on a one-by-one basis to said plurality of word lines and to either ground or said supply voltage, thereby to provide a unique set of output signals from said bit lines upon activation of a word line by said logic circuitry.

\* \* \* \* \*